(12) United States Patent
Meltaus et al.

(10) Patent No.: US 11,374,551 B2
(45) Date of Patent: **\*Jun. 28, 2022**

(54) WIDE-BAND ACOUSTICALLY COUPLED THIN-FILM BAW FILTER

(71) Applicant: Teknologian tutkimuskeskus VTT Oy, Espoo (FI)

(72) Inventors: Johanna Meltaus, Espoo (FI); Tuomas Pensala, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 23 days.

This patent is subject to a terminal disclaimer.

(21) Appl. No.: 17/008,077

(22) Filed: Aug. 31, 2020

(65) Prior Publication Data

US 2021/0058066 A1 Feb. 25, 2021

Related U.S. Application Data

(63) Continuation of application No. 15/893,717, filed on Feb. 12, 2018, now Pat. No. 10,778,186, which is a
(Continued)

(30) Foreign Application Priority Data

Oct. 14, 2010 (FI) .................................... 20106063

(51) Int. Cl.
*H03H 9/54* (2006.01)
*H03H 9/56* (2006.01)

(52) U.S. Cl.
CPC ............ *H03H 9/547* (2013.01); *H03H 9/564* (2013.01); *H03H 9/568* (2013.01)

(58) Field of Classification Search
CPC .......... H03H 9/54; H03H 9/547; H03H 9/564; H03H 9/568
See application file for complete search history.

(56) References Cited

U.S. PATENT DOCUMENTS 3,564,463 A 2/1971 Beaver et al.
3,944,951 A 3/1976 Kurth
(Continued)

FOREIGN PATENT DOCUMENTS

CN 1695298 A 11/2005
CN 101185241 A 5/2008
(Continued)

OTHER PUBLICATIONS

Allah et al. "Solidly Mounted Resonators with Layer-Transferred AlN using Sacrificial Crystalline Surfaces", IEEE, 2009.
(Continued)

*Primary Examiner* — Dean O Takaoka
(74) *Attorney, Agent, or Firm* — Laine IP Oy

(57) ABSTRACT

The invention relates to an acoustically coupled thin-film BAW filter, comprising a piezoelectric layer, an input-port on the piezoelectric layer changing electrical signal into an acoustic wave (SAW, BAW), and an output-port on the piezoelectric layer changing acoustic signal into electrical signal. In accordance with the invention the ports include electrodes positioned close to each other, and the filter is designed to operate in first order thickness-extensional TE1 mode.

19 Claims, 21 Drawing Sheets

Related U.S. Application Data continuation of application No. 13/879,028, filed as application No. PCT/FI2011/050891 on Oct. 14, 2011, now Pat. No. 9,893,712.

(60) Provisional application No. 61/392,955, filed on Oct. 14, 2010.

(56) References Cited

U.S. PATENT DOCUMENTS

| | | | |
|---|---|---|---|
| 6,509,814 | B2 | 1/2003 | Milsom |
| 7,474,174 | B2 | 1/2009 | Milsom et al. |
| 8,008,993 | B2 | 8/2011 | Milsom et al. |
| 8,058,768 | B2 * | 11/2011 | Milsom .......... H03H 9/175 310/313 R |
| 9,893,712 | B2 * | 2/2018 | Meltaus .......... H03H 9/568 |
| 10,778,186 | B2 * | 9/2020 | Meltaus .......... H03H 9/547 |
| 2001/0052831 | A1 | 12/2001 | Milsom |
| 2006/0091978 | A1 | 5/2006 | Wang et al. |
| 2008/0129414 | A1 | 1/2008 | Lobl et al. |
| 2008/0051039 | A1 | 2/2008 | Iwasaki et al. |
| 2008/0079515 | A1 | 4/2008 | Ayazi et al. |
| 2008/0180193 | A1 | 7/2008 | Iwasaki et al. |
| 2008/0297279 | A1 | 12/2008 | Thalhammer |
| 2012/0062068 | A1 | 3/2012 | Wathen et al. |
| 2013/0278356 | A1 | 10/2013 | Meltaus et al. |

FOREIGN PATENT DOCUMENTS

| | | |
|---|---|---|
| JP | 2008079294 A | 4/2008 |
| JP | 2008543157 A | 11/2008 |
| WO | WO2006126168 A1 | 11/2006 |
| WO | WO2007060557 A1 | 5/2007 |

OTHER PUBLICATIONS

Fattinger et al. "Single-to-balanced Filters for Mobile Phones using coupled Resonator BAW Technology", 2004 IEEE Ultrasonics Symposium, pp. 416-419.

Meltaus et al. "Laterally Coupled BAW Filters With 5% Bandwidth", 2010 IEEE International Ultrasonics Symposium Proceedings, pp. 966-969.

Pan et al. "A low-loss 1.8GHz monolithic thin-film piezoelectric-on-substrate filter", MEMS 2008, Tucson, AZ, USA, Jan. 13-17, 2008, pp. 176-179.

Qin et al. "Mass sensitivity of thin film bulk acoustic wave resonator based on c-Axis ZnO Film". In Proceedings of IEEE International Ultrasonic Symposium 2010, Oct. 11-14, 2010, pp. 1267-1271.

Fattinger et al. "Optimization of Acoustic Dispersion for High Performance Thin Film BAW Resonators", 2005 IEEE Ultrasonics Symposium, pp. 1175-1178.

Wathen et al: A GHz range, Single Structure, Multi-Mode ZnO Solidly-Mounted Bulk Acoustic Resonator. IEEE, 2010. 4 pages.

Meltaus et al: Laterally Coupled Solidly Mounted BAW Resonators at 1.9 GHz. 2009 IEEE International Ultrasonics Symposium Proceedings, 2009, pp. 847-850.

Munir et al: A GHz range, single structure, multi-mode ZnO, solidly-mounted bulk acoustic resonator. 2010 IEEE International Ultrasonics Symposium, 2010, pp. 853-856.

Wathen et al: A high-Q hybrid acoustic mode in thin film ZnO solidly mounted resonators. Applied Physics Letters, 2009, vol. 95.

* cited by examiner

WIDE-BAND ACOUSTICALLY COUPLED THIN-FILM BAW FILTER

FIELD OF INVENTION

The present invention relates to a wide-band acoustically coupled thin-film Bulk Acoustic Wave (BAW) filter according to the preamble of claim 1.

BACKGROUND OF THE INVENTION

Radio-frequency (RF) components, such as resonators and filters, based on microacoustics and thin-film technology are widely used in radio applications such as: mobile phones, wireless networks, satellite positioning, etc. Their advantages over their lumped-element counterparts include small size and mass-production capability. Two fundamental microacoustic technologies used for RF devices are surface acoustic wave (SAW) and bulk acoustic wave (BAW) technologies.

In this section, existing filter technologies are briefly introduced to provide background for the current invention.

Surface Acoustic Wave Devices

A schematic picture of a SAW device is shown in FIG. 1A. Interdigital transducers (IDTs) 2, 3 (comb-like structures of thin-film metal strips) are patterned on a piezoelectric substrate 1. The piezoelectric substrate is, for example, quartz, LiNbO3 or LiTaO3. The IDTs are used to transform the electric input signal Vin into an acoustic wave via the piezoelectric effect, as well as to pick up the acoustic signal at the output port and transform it back to an electrical form. The operation frequency of a SAW device depends on the velocity of the acoustic wave and the dimensions of the IDT electrodes:

$$f \propto \frac{v}{2p}$$

where f is the frequency, p is the period of the IDT, see FIG. 1B, and v is the velocity of the surface wave. Therefore, higher operation frequencies require smaller p if the velocity is kept constant.

SAW transducers are typically periodic, although the period may be more complex than that presented in FIG. 1B.

Bulk Acoustic Wave Devices

In a BAW device, acoustic vibration inside a piezoelectric wafer or a thin film is used to process the electrical input signal. The piezoelectric material used for the thin film in the devices typically belongs to the 6 mm symmetry group, e.g. ZnO, AlN and CdS. Other piezoelectric materials can be used as well, such as quartz, $LiNbO_3$, $LiTaO_3$, etc. A schematic cross-section of a solidly-mounted BAW resonator (SMR) is presented in FIG. 2A and of a self-supported (membrane type) resonator in FIG. 2B. In an SMR, an acoustic Bragg mirror composed of alternating high and low acoustic impedance (Z) material layers serves to isolate the vibration in the piezoelectric thin film from the substrate and to prevent acoustic leakage. In the membrane device the same is accomplished by fabricating the resonator on a self-standing membrane.

The area of a BAW resonator is typically determined by the static capacitance needed to match the device to the system impedance. Filters can be constructed of resonators by connecting resonators electrically. A common example is a ladder filter, in which resonators are connected in T- or Pi-sections (FIG. 3). Designing the resonance frequencies appropriately, one can achieve a passband response. Increasing the number of sections helps to widen the passband. The out-of-band signal suppression is determined by the capacitances of the resonator structure and is typically on the order of ~25 dB. The in-band losses are mainly determined by the Q-values of the resonators.

Vibration Modes and Dispersion Types

In the piezoelectric layer of an acoustic resonator, different bulk acoustic vibration modes arise as the excitation frequency f is swept. In BAW devices, the propagation direction of the bulk wave is typically along the thickness axis (z axis). Particle displacement is either perpendicular to the propagation direction (shear wave) or parallel to the propagation direction (longitudinal wave). Bulk modes are characterized by the number of half-wavelengths of the bulk wavelength $\lambda_z$ that can fit into the thickness of the resonator structure (piezoelectric layer and electrodes). In addition, the bulk modes can propagate in the lateral (perpendicular to z-axis) direction as plate waves with lateral wavelength $\lambda_\parallel$. This is illustrated in FIG. 4A for two bulk modes (longitudinal and shear). In a finite-sized resonator, plate waves reflecting from resonator edges can cause laterally standing waves and consequently lateral resonance modes.

Acoustic properties of a BAW resonator can be described with dispersion curves, in which the lateral wave number $k_\parallel$ of the vibration is presented as a function of frequency. FIG. 4B shows an example of dispersion properties in a BAW resonator. Dispersion curves of the electroded (active) region are plotted with a solid line and those of the non-electroded (outside) region with dashed line. The first-order longitudinal (thickness extensional, TE1) vibration mode, in which the thickness of the piezoelectric layer contains approximately half a wavelength of the bulk vibration, and the second-order thickness shear (TS2) mode, in which the bulk vibration is perpendicular to the thickness direction and one acoustic wavelength is contained in the piezoelectric layer thickness, are denoted in the figure. This type of dispersion, in which the TE1 mode has increasing $k_\parallel$ with increasing frequency, is called Type 1. Type 1 materials include, e.g. ZnO. Aluminum nitride is inherently Type 2 (in FIG. 4B, TE1 mode is the lower dispersion curve, and TS2 mode is the upper dispersion curve), but with an appropriate design of the acoustic Bragg reflector, the resonator structure's dispersion can be tailored to be of Type 1.

In FIG. 4B, positive values of $k_\parallel$ denote real wave number (propagating wave) and negative values correspond to imaginary wave number (evanescent wave). For a resonance to arise, the acoustic energy must be trapped inside the resonator structure. In the thickness direction, isolation from the substrate (mirror or air gap) ensures the energy trapping. In the lateral direction, there should be an evanescent wave outside the resonator region for energy trapping. Energy trapping is possible between frequencies $f_{o1}$ and $f_{o2}$. Frequency range for which energy trapping occurs for the TE1 mode, $f_{o2}-f_a$, is shaded in FIG. 4B. Energy trapping is easier to realize in Type 1 dispersion. Therefore, when using AlN as the piezoelectric material, the mirror is usually designed so that it converts the dispersion into Type 1. This limits somewhat the design of the acoustic mirror.

As the lateral wave number $k_\parallel$ increases on a dispersion curve (lateral wavelength decreases), lateral standing wave resonances (plate modes) appear in the resonator structure. For a plate mode to arise, the width of the resonator W must equal an integer number of half wavelengths of the plate mode:

$$W = N\frac{\lambda_m}{2}$$

for the mode m with wavenumber $k_m=2\pi/\lambda_m$.

Acoustical Coupling in BAW Devices

A filter can be made by electrically connecting one-port resonators to form a ladder or a lattice filter. Another possibility is to arrange mechanical (acoustic) coupling between resonators by placing them close enough to each other for the acoustic wave to couple from one resonator to another. Such devices are called coupled resonator filters (CRF).

In BAW devices, vertical acoustic coupling between stacked piezoelectric layers is used in stacked crystal filters (SCF, see FIG. 5A) and vertically coupled CRFs (FIG. 5B). In an SCF, two piezoelectric layers are separated by an intermediate electrode. In a vertically coupled CRF, coupling layers are used to modify the coupling strength between the piezo layers. The CRF can be fabricated either using the SMR or the air-gap technology.

A thin-film vertically coupled CRF has been shown to give a relatively wide-band frequency response (80 MHz at 1850 MHz center frequency, or 4.3% of center frequency, FIG. 8 from G. G. Fattinger, J. Kaitila, R. Aigner and W. Nessler, "Single-to-balanced Filters for Mobile Phones using coupled Resonator BAW Technology", Proc. IEEE Ultrasonics Symposium, 2004, pp. 416-419) with the capability of unbalanced-to-balanced (balun) conversion. The disadvantage of the vertically coupled CRFs is the need for a large number of layers and their sensitivity to the thickness of the piezolayers. This makes the fabrication process difficult and consequently expensive.

Lateral acoustical coupling in BAW (LBAW) can be realized with 2 or more narrow electrodes placed on the piezoelectric layer 1 (FIG. 6) on a thin layer structure 4, in such a way that the acoustic vibration can couple in the lateral direction from one electrode to another. Electrical input signal in Port 1, 5 is transformed into mechanical vibration via the piezoelectric effect. This vibration couples mechanically across the gap to Port 2, 6 and creates an output electrical signal. Electrodes in this example are interdigital (comb-like). Coupling strength is determined by the acoustic properties of the structure and by the gap between the electrodes.

Bandpass frequency response is formed by two laterally standing resonance modes arising in the LBAW structure, as illustrated in FIGS. 7A and 7B for a two-electrode structure. In the even mode resonance, both electrodes vibrate in-phase, whereas in the odd mode resonance their phases are opposite. For a Type 1 resonator, the even mode, having a longer wavelength, is lower in the frequency than the shorter-wavelength odd mode. The frequency difference between the modes determines the achievable bandwidth of the filter, and depends on the acoustic properties of the structure and on the electrode dimensions.

Vertical CRF's have disadvantages as they are difficult and costly to fabricate, i.e. they require several layers and are sensitive to piezoelectric films' thickness.

LBAW is therefore advantageous because it has a simple fabrication process and the operation frequency is mainly determined by the piezolayer thickness, though to a lesser extent by electrode geometry. So far however, the obtained bandwidth has been too narrow, i.e. 2%-3% of the center frequency.

One problem with LBAW filters is the gently sloping edges of the pass band, which can limit the area of application of the components. By steepening the sloping edges, the competitiveness of LBAW filters would improve significantly.

SUMMARY OF THE INVENTION

It is an object of the present invention to provide a wide-band acoustically coupled bulk acoustic wave (BAW) filter based on thin-film technology and piezoelectric thin films.

An aspect of embodiments of the present invention is that the filters are operable in the GHz frequency range.

More specifically, the filter according to the invention is characterized by what is stated in the characterizing portion of Claim 1.

Considerable advantages are gained with the aid of the invention. Examples of advantages which can be obtained through embodiments of the invention are as follows.

Wide frequency bandwidth at GHz frequencies is possible. At least in some embodiments, the frequency bandwidth is better than that of known acoustic wave components.

The invention also has embodiments, in which there is the possibility to operate the filter at high frequencies, e.g. 1-5 GHz. As frequency is determined mainly by film thicknesses, this means that lithography is not necessarily a principal limiting factor, as it is for SAW components.

Further advantages achievable by means of at least some embodiments are the relatively simple fabrication process, e.g. established BAW process with only one piezoelectric layer, compared to competing coupled-resonator BAW technologies, comparatively small component size compared to, e.g. SAW and ladder BAW components, and high out-of-band suppression compared to, e.g. ladder BAW filters.

It is a further objective of one or more embodiments of the present invention to offer a solution relating to the steepening of the stop-band attenuation of LBAW filters.

Also, some embodiments provide a solution permitting a steep stop-band farther from the pass band and taking up much less space than known solutions. This is possible, at least in part, due to the simpler construction presented herein. There is additionally provided a solution permitting balun operation and a change in impedance from one port to another.

According to an embodiment, there is disclosed a band-pass filter with wide (e.g. 5% relative to center frequency) passband which is achieved using lateral acoustic coupling between piezoelectric bulk acoustic wave (BAW) resonators. The device is preferably designed such that one bulk wave mode, e.g., first-order longitudinal thickness mode, is used to produce the passband. With the correct design of the acoustic and electric properties, a bandwidth comparable to or wider than that of the current known acoustic filter components, i.e. surface or bulk acoustic wave, SAW/BAW devices, is obtained at GHz frequencies, e.g. 1-5 GHz.

Some of the benefits of the embodiments are achieved by adding an acoustic resonator or resonators in series or in parallel with the filters. Thus, by using the operating frequency of the resonator it is possible to create a deep dip in the frequency response of the filter which both increasing the steepness of the edges of pass band and stop-band attenuation in the vicinity of the pass band.

There are several applications in which such possibilities are of benefit. The addition of a zero above and/or below the pass band steepens the edges of the pass band and improves stop-band attenuation. With the aid of parallel resonance in parallel resonators and series resonance in series resonators, pass-band attenuation can be reduced, or bandwidth increased.

It is then preferable to select the frequencies in such a way that a parallel resonator produces a zero below the pass band, and a series resonator produces a zero above the band. The stop-band attenuation in LBAW resonators increases as one moves farther from the pass band, whereas in ladder filters, for example, it decreases or remains the same at a level determined by the capacitances of the resonators.

Furthermore, a LBAW filter can implement a balun functionality inside a filter, without a separate component. A balun filter with a steep pass band and a simple manufacturing process is herein possible. Resonators also act as matching elements for an LBAW filter. Compared to pure ladder resonators, which have a steep band, embodiments of the present invention differ in the type of acoustic coupling and the filter construction. A LBAW plus resonators can take up less space, as fewer resonators are needed and stop-band attenuation far from the pass band is better.

BRIEF DESCRIPTION OF THE DRAWINGS

In the following, the invention is described with the aid of examples and with reference to the accompanying drawings.

DETAILED DESCRIPTION OF EXAMPLE EMBODIMENTS

Figure 6:
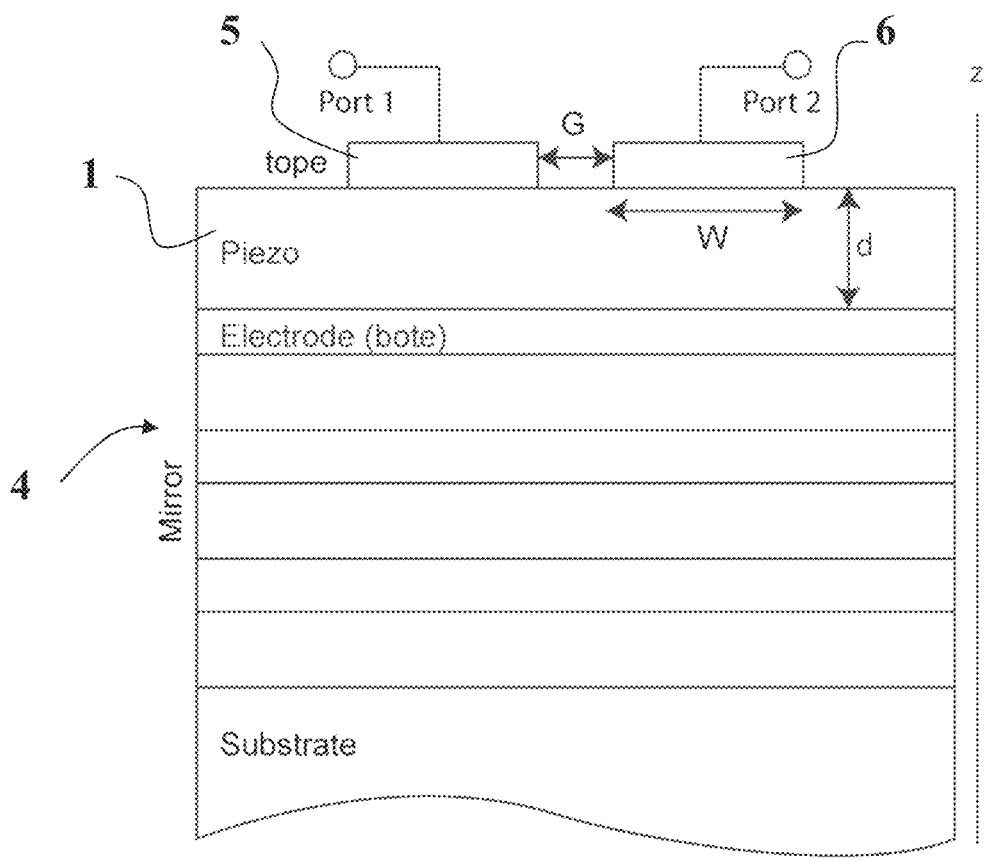
FIG. 6: Schematic of a two-electrode SMR LBAW structure.
Figure 7A:
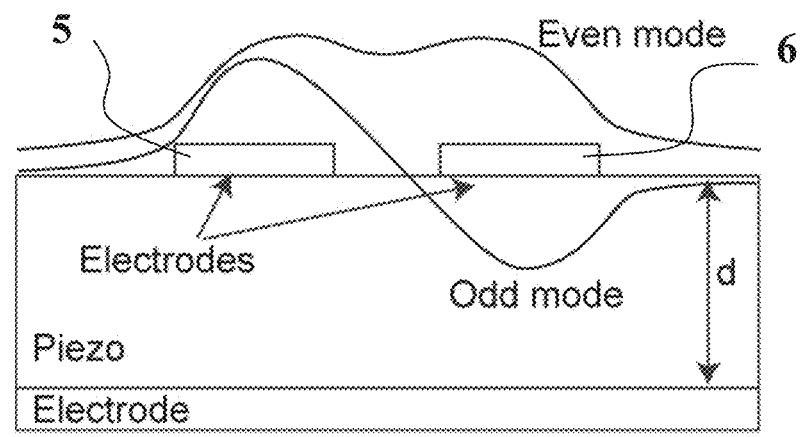
FIG. 7A: Schematic illustration of the operation principle of a 2-electrode LBAW.
Figure 7B:
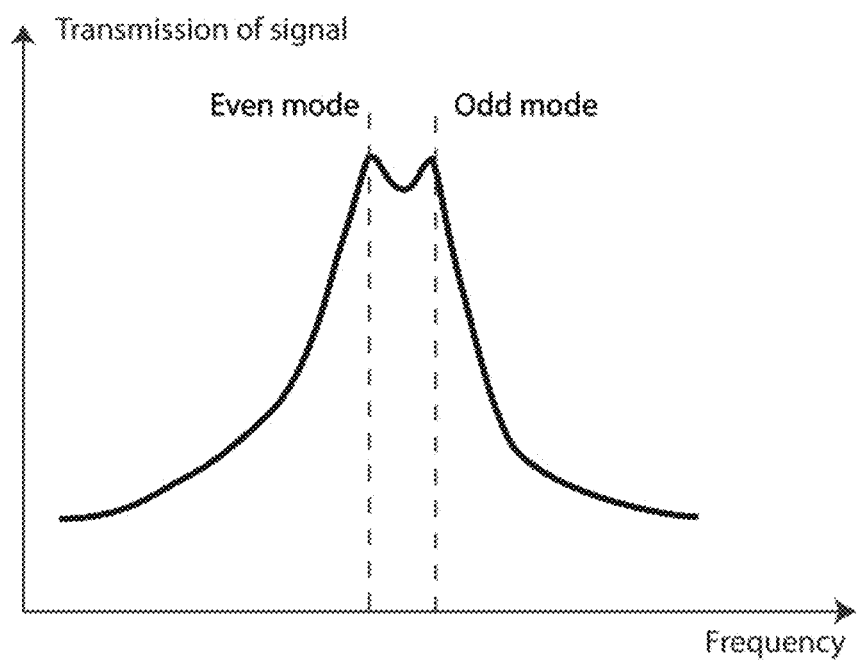
FIG. 7B: The two plate modes (even and odd) create a 2-pole filter response.
Figure 8:
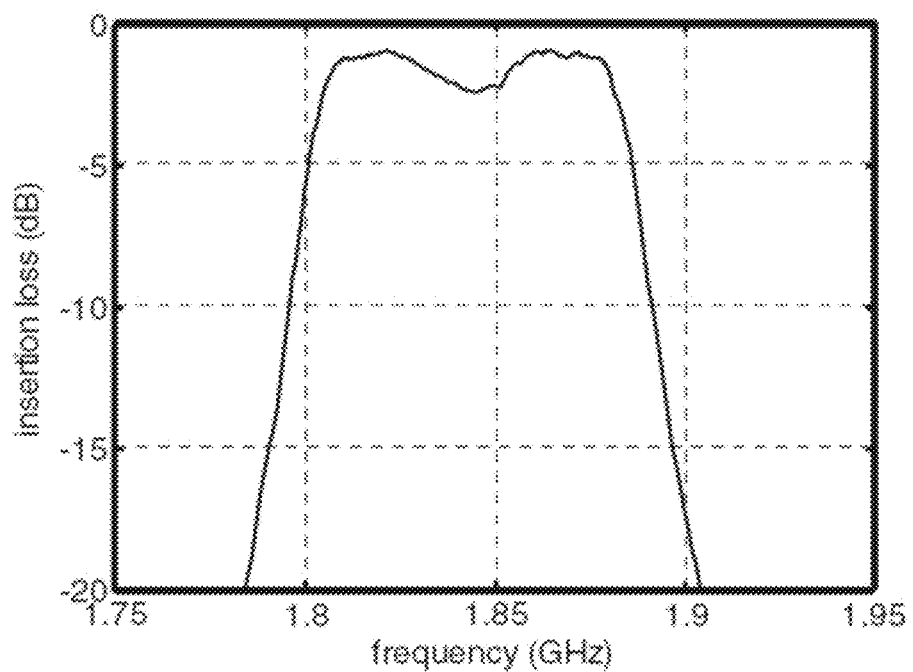
FIG. 8: Examples of electrical response of a vertically coupled CRF. In the example, minimum insertion loss is 1 dB and the 3-dB bandwidth in (a) is ~80 MHz (4.3% at 1850 MHz center frequency).

The filter described herein is based on the SMR LBAW structure shown in FIG. 6. Electrodes in this example are interdigital (comb-like), although other geometries, e.g. circular, are possible as well.

The LBAW filters according to example embodiments are designed to operate in the first-order thickness-extensional TE1 mode. This is because many piezoelectric thin film materials have electromechanical coupling stronger in the thickness direction, meaning that the longitudinal vibration couples efficiently to the electrical excitation which is over the thickness of the piezoelectric layer.

Based on an exemplary demonstrator filter described below, an example structure for creating a wideband response is characterized by:

A BAW structure comprising an acoustic Bragg mirror 4, electrodes and piezoelectric layer. While the piezoelectric material used in the example is AlN, other 6 mm symmetry group piezoelectrics, such as ZnO, can be used as well. Furthermore, thin-film forms of other piezoelectric materials, such as known SAW materials like $LiNbO_3$, $LiTaO_3$, can be used. The BAW structure is further characterized in that it has Type 1 dispersion.

The filter structure has interdigital electrode structure with two ports, in this case metal although other conductive materials can be used, with electrodes 5 and 6 deposited on the thin-film piezoelectric layer. The electrode structure is designed such that the electrodes are connected alternating to port 1 (input) 2 and port 2 (output) 3.

In an embodiment, the number of electrodes 5 and 6 is 31 in total. Their width is 3 μm, the gap between electrodes is 2 μm, and the length of the electrodes is 200 μm.

From the sake of clarity, the different regions of the layer stack having top metal will be referred to as the electrode region. The region that has no top metal and is outside of the electrodes is referred to as the outside region.

According to an embodiment, the thin-film layer stack is designed as follows. The mass loading by top the electrode, determined by the top electrode thickness and material density, is such that the frequency difference between the $k_\parallel=0$ frequency of the electrode region's TE1 mode and the outside region's TS2 mode is small. More particularly, such that the $k_\parallel=0$ frequency of the outside region's TS2 mode is 95%-99% of the electrode region's TE1 cutoff frequency. In the present example the $k_\parallel=0$ frequency of the outside region's TS2 mode is 97.3%.

The frequency difference between the outside region's TS2 and TE1 modes' $k_\parallel=0$ frequencies is designed to be large, e.g. 5%-15% of the electrode region's TE1 mode cutoff frequency. The frequency difference in the present example has been designed to be 6.7%.

Figure 4A:
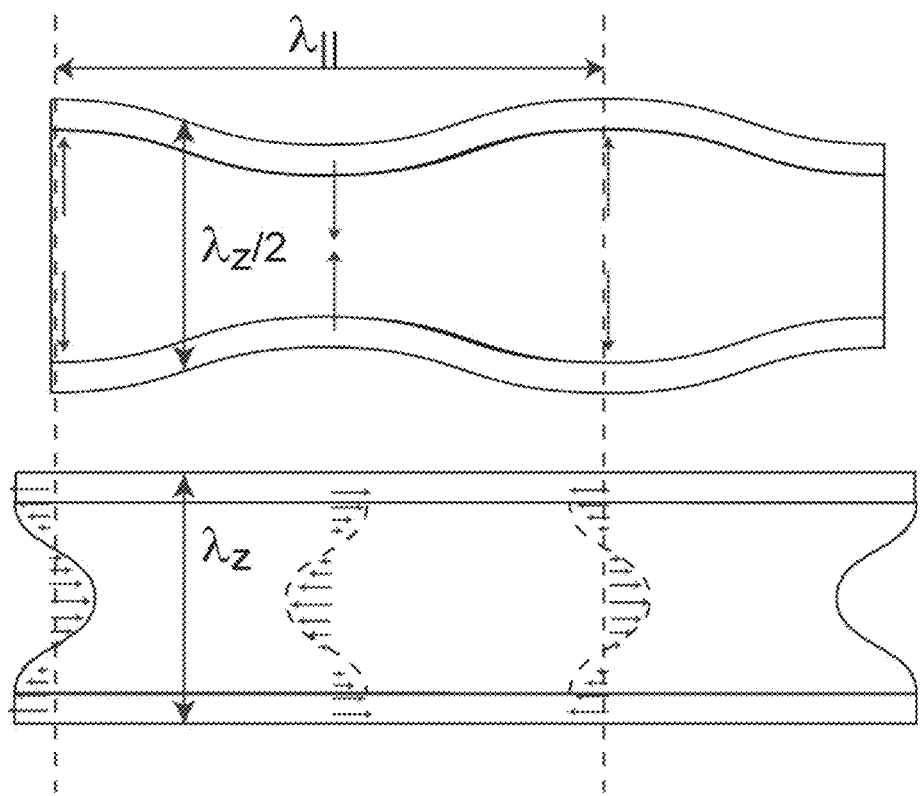
FIG. 4A: Bulk mode propagation for two bulk modes (longitudinal and shear).
Figure 4B:
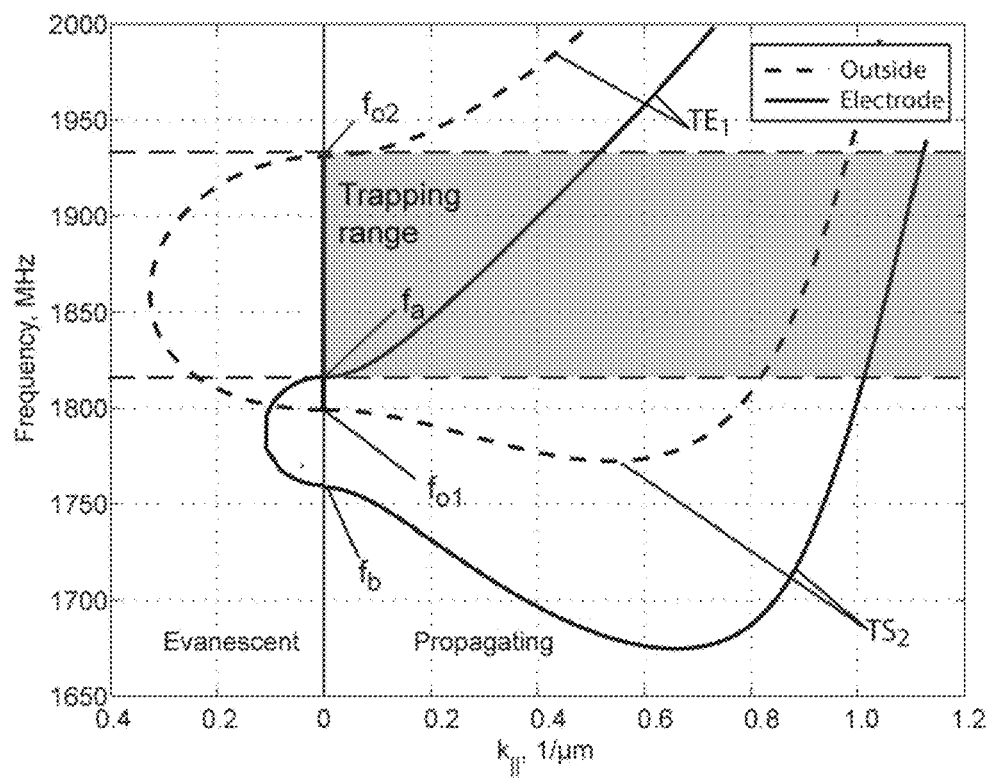
FIG. 4B: Schematic picture of dispersion curves of a BAW resonator.
Figure 5A:
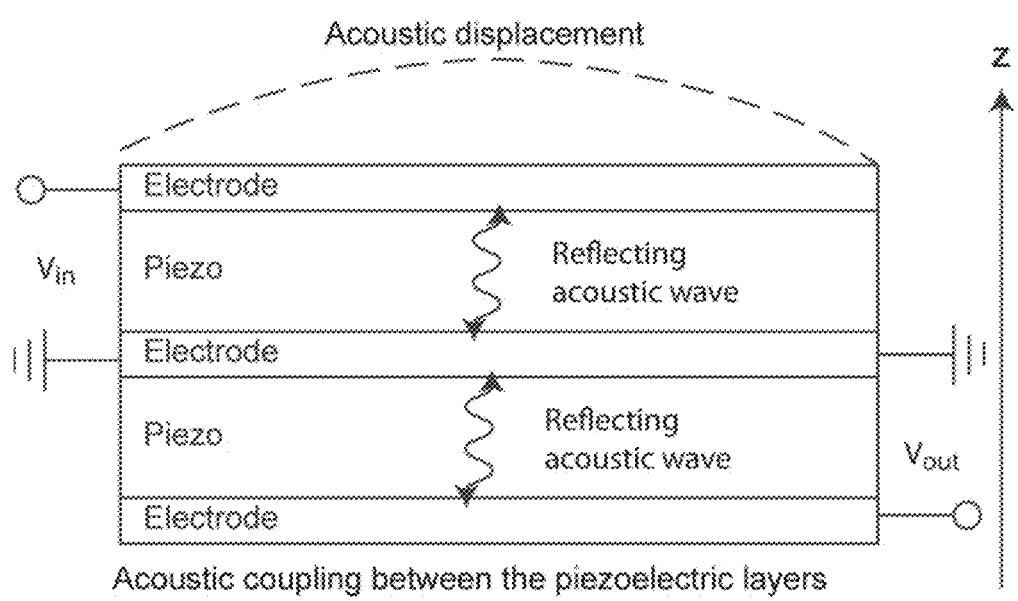
FIG. 5A: Schematic illustration of a stacked crystal filter.
Figure 5B:
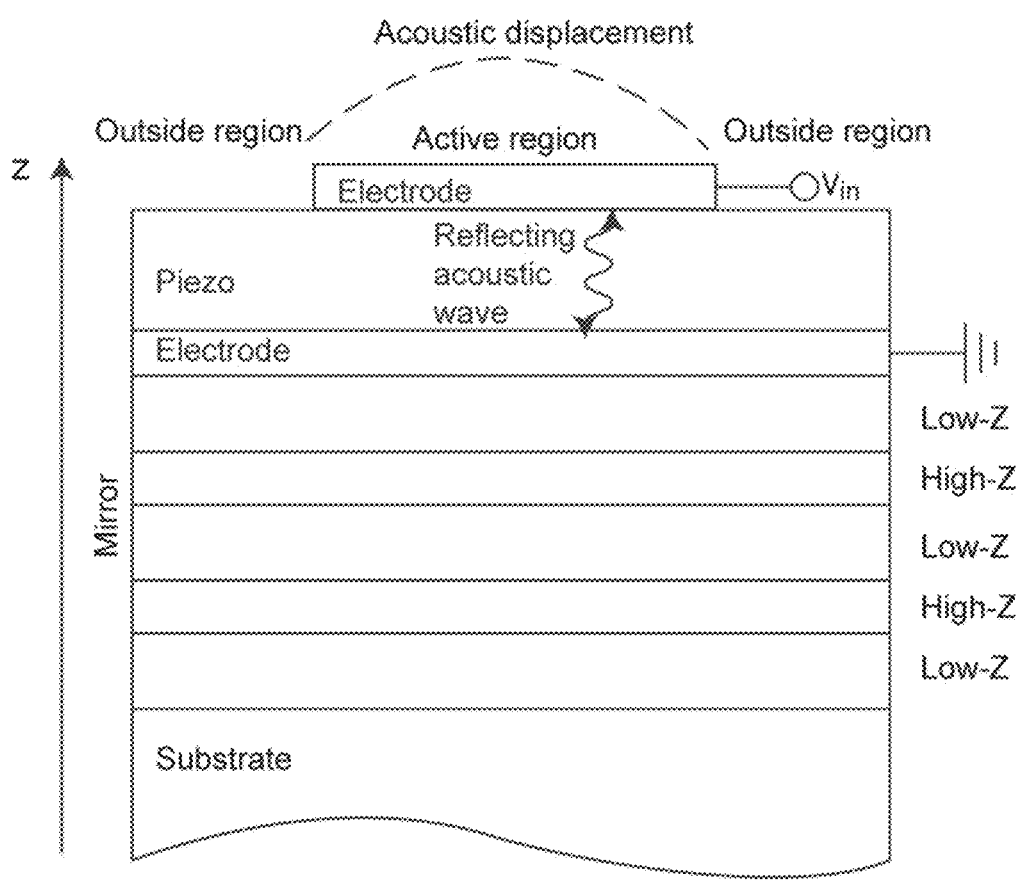
FIG. 5B: Schematic illustration of vertical SMR-type BAW CRF.

According to certain embodiments of the present invention, the frequency distance outside TS2 and TE1 is greater than, or equal to 98%, more particularly between 98% and 99.5%, more particularly still as shown in FIG. 4B as 98.9%. Similarly, the frequency distance expressed as the frequency difference between TE1 and TS2 k=0 frequencies: (electrode te1–outside ts2)/outside ts2 should be small, for example on the order of 1%. As an example, said frequency distance is preferably between 0.2% and 2.1%, more particularly between 0.5% and 1.8%, still more particularly between 0.8% and 1.5%, more particularly still as shown in FIG. 4B as 1.1%.

Another feature that has to be designed appropriately is the electrode topology. The electrode topology should be designed such that the gap width G ensures good coupling at the even mode. For example, at least for the most common applications, the gap width should be designed to be 20%-120%, preferably 25%-110% of the evanescent acoustic wave's decay length, i.e. the length at which amplitude $A=A_0*1/e$ of the original amplitude $A_0$, in the gap at the desired even resonance mode.

Although an SMR type structure is used in the present example, the present invention is not limited to that type of structure. Other structures such as air-gap structures can be used as well, as long as the acoustic properties are designed appropriately.

Additionally, other bulk vibration modes besides the TE1 can be utilized. However, the piezoelectric coupling of the driving electric field to the used bulk acoustic mode should preferably be strong enough so that low losses can be obtained.

Alternatively, gap width G can be determined normalized to the piezolayer thickness d. For example, G can be designed to be 25%-200% of d. In the present example G is designed as 102% of d.

Electrode width W is designed such that multiple half-wavelengths cannot fit within the electrode width. For example, W is designed to be smaller than the lateral acoustic wave's wavelength $\lambda_{odd}$ at the desired odd resonance mode.

The number of electrodes N, electrode width W and gap width G are designed such that the desired wavelength of the lateral acoustic wave at the even mode resonance frequency is achieved. That is, $N*W+N*G=\lambda_{even}/2$, where $\lambda_{even}$ is the wavelength of the lateral acoustic wave at the even mode resonance frequency. For the present example: N=31, W=3 and G=2. Additionally, the total width of the structure $N*W+N*G$ is such that the highest-order mode trapped in the structure is the desired odd mode resonance.

The electrode width W is designed such that the wavelength of the lateral acoustic wave at the desired odd mode resonance frequency, $\lambda_{odd}$, is obtained. For example: W=25%-50% of $\lambda_{odd}$.

The tables 1-3 below define acceptable thickness ranges for thin-film layers according to typical embodiments of the present invention. The piezo layer thickness d (minimum and maximum value) is first determined with respect to the acoustic wavelength in the piezo material ($\lambda$) at the operation frequency f. Thicknesses (min and max) of top electrode (tope), bottom electrode (bote) and the topmost mirror layer (M1) are then defined with respect to the piezo layer thickness. Tope, bote and M1 are labeled in the general schematic of FIG. 6A. The mirror layers underlying the topmost mirror layer M1 are designed such that the required wave reflectivity is obtained. A starting point can be, for example, a thickness that equal one quarter of the acoustic wavelength in the material.

Device operation is dependent on the combination of these layer thicknesses. Therefore the thicknesses are not independent. More than one layer may contribute to one acoustic or dispersion property, and one layer may also contribute to several properties.

TABLE 1

Wide range layer thickness percentage

| Layer | Typical material | Symbol | Min, % of $\lambda$ | Max, % of $\lambda$ | Min, % of d | Max, % of d |
|---|---|---|---|---|---|---|
| Piezo | AlN | d | 23 | 50 | | |
| Top electrode | Al | tope | 0.8 | 7.5 | 3.4 | 22 |
| Bottom electrode | Mo | bote | 1.3 | 20 | 5.7 | 40 |
| Top mirror | SiO2 | M1 | 9.7 | 35 | 42 | 70 |

TABLE 2

Medium range layer thickness percentage

| Layer | Typical material | Symbol | Min, % of $\lambda$ | Max, % of $\lambda$ | Min, % of d | Max, % of d |
|---|---|---|---|---|---|---|
| Piezo | AlN | d | 27 | 41 | | |
| Top electrode | Al | tope | 1.3 | 4.2 | 4.9 | 10.3 |
| Bottom electrode | Mo | bote | 3.1 | 1189 | 11.4 | 29 |
| Top mirror | SiO2 | M1 | 12.7 | 25.8 | 47 | 63 |

TABLE 3

Tight range layer thickness percentage

| Layer | Typical material | Symbol | Min, % of $\lambda$ | Max, % of $\lambda$ | Min, % of d | Max, % of d |
|---|---|---|---|---|---|---|
| Piezo | AlN | d | 30 | 37 | | |
| Top electrode | Al | tope | 1.7 | 3.5 | 5.7 | 9.5 |
| Bottom electrode | Mo | bote | 4.5 | 7.0 | 15 | 19 |
| Top mirror | SiO2 | M1 | 15 | 21.5 | 50 | 58 |

Table 3 is representative of the present example. When the piezo layer thickness is chosen to be 1960 nm (35% of $\lambda$) as in the present example, the different ranges provide the following layer thicknesses (in nm) in tables 4-6:

TABLE 4

Wide range layer thickness values

| Layer | Typ. material | Thickness min (nm) | Thickness max (nm) |
|---|---|---|---|
| piezo | AlN | 1960 | |
| tope | Al | 67 | 294 |
| bote | Mo | 112 | 784 |
| M1 | SiO2 | 823 | 1372 |

TABLE 5

Medium range layer thickness values

| Layer | Typ. material | Thickness min (nm) | Thickness max (nm) |
|---|---|---|---|
| piezo | AlN | 1960 | |
| tope | Al | 96 | 202 |
| bote | Mo | 223 | 568 |
| M1 | SiO2 | 921 | 1235 |

TABLE 6

Tight range layer thickness values

| Layer | Typ. material | Thickness min (nm) | Thickness max (nm) |
|---|---|---|---|
| piezo | AlN | 1960 | |
| tope | Al | 112 | 186 |
| bote | Mo | 294 | 372 |
| M1 | SiO2 | 980 | 1137 |

Once the design is chosen, it is determined if matching to the system impedance level is achieved. The design, i.e. N, W, and electrode length, is then modified when necessary, such that matching to the system impedance level is achieved while retaining a desired loss level within the passband.

1.

Steepness of passband edges can be improved by adding, in parallel and/or in series, resonators before and/or after the filter.

Example Filter with Measurement Results

One exemplary example is described herein along with the corresponding measurement results from the example filter. The structure of the filter will now be described below.

The filter of the present example consists of a thin-film stack. The nominal thin-film layer thicknesses of the acoustic stack are set forth in Table 7, from bottom to top. The substrate of the filter in the example is silicon. The electrode structure used is interdigital and similar to that shown in FIG. 1B. A microscope image of the present example is also presented in FIG. 9. The total number of electrodes in 5 and 6 is N=31, the electrode width W=3 µm, the gap width G=2 µm, the electrode length L=200 µm and the probe pad size is 150 µm×150 µm.

Figure 1A:
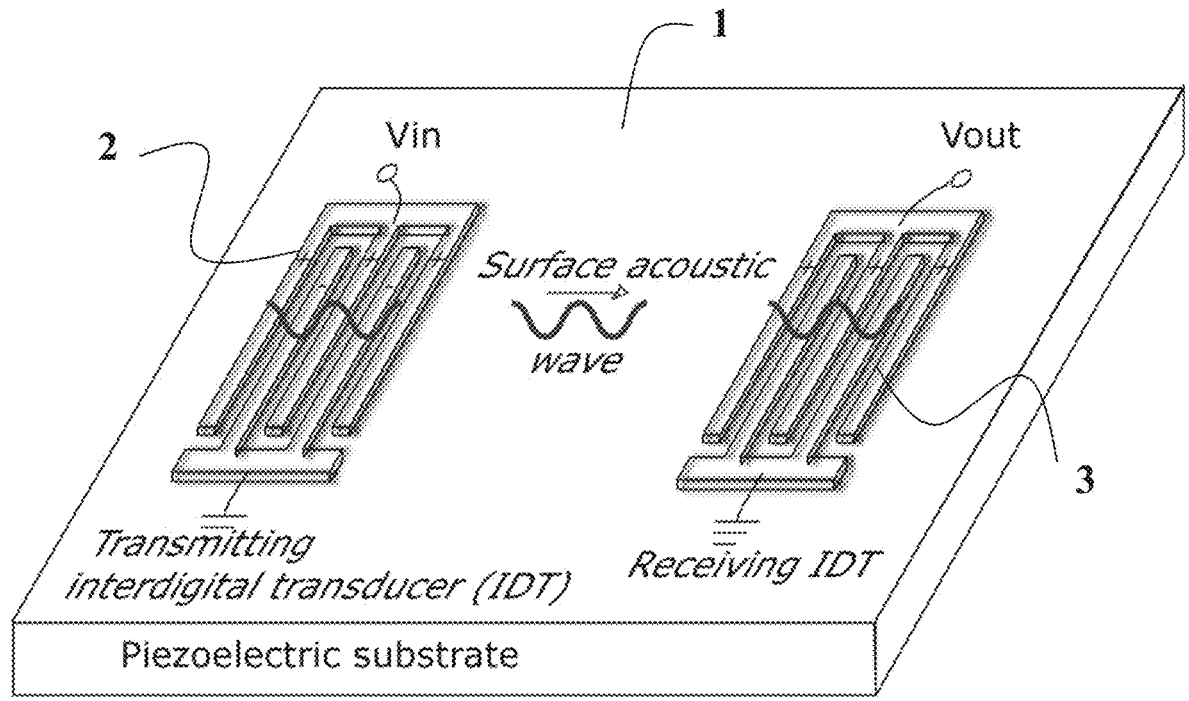
FIG. 1A: Schematic of a SAW device.
Figure 1B:
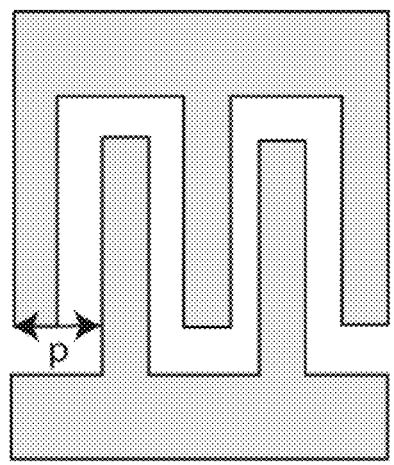
FIG. 1B: Schematic of a SAW interdigital transducer.
Figure 2A:
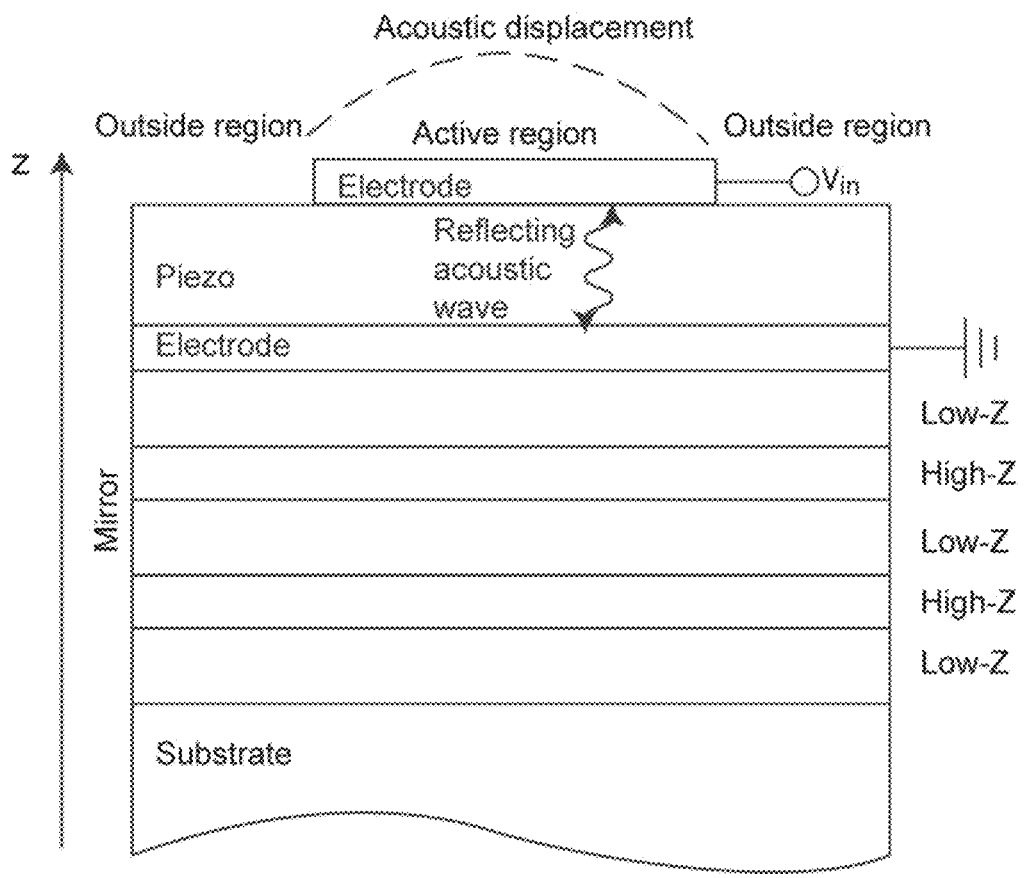
FIG. 2A: Solidly-mounted BAW resonator.
Figure 2B:
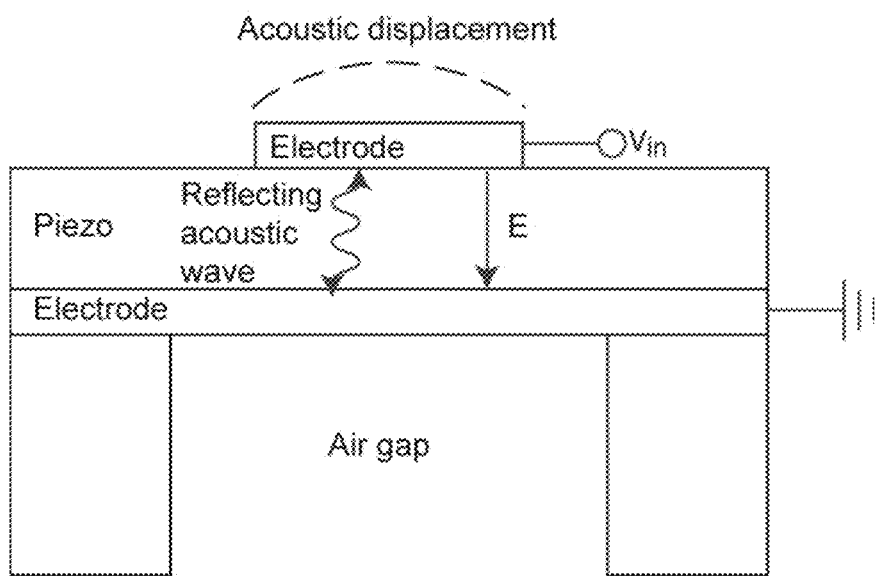
FIG. 2B: Air-gap BAW resonator.
Figure 3:
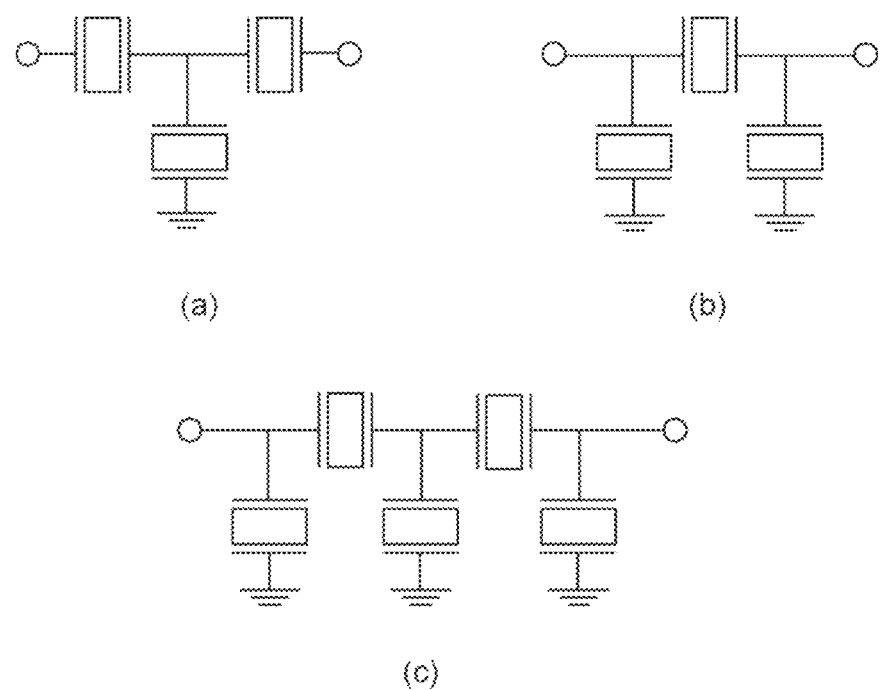
FIG. 3: Schematic of electrical connection of resonators in (a) T-section, (b) Pi-section. (c) 5-pole/2-section ladder filter. There is no acoustic connection between the resonators.
Figure 9:
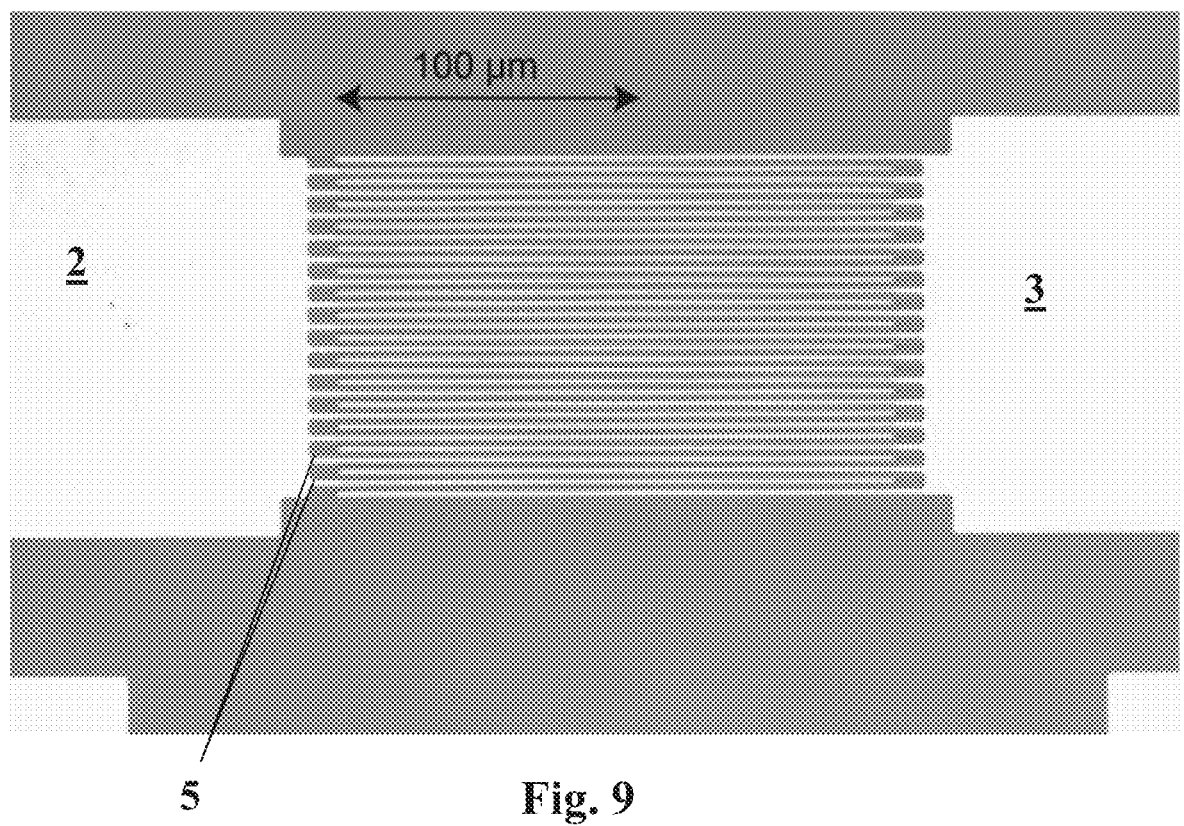
FIG. 9: Microscope image of a 31-electrode LBAW designed and fabricated at VTT. Electrode width W=2 μm, gap width G=2 μm, electrode length L=200 μm.

Although the electrode and gap width W and G are constant in FIG. 1B as well as in the component introduced below in FIG. 9, the structure need not be limited to constant W/G and/or constant period.

TABLE 7

Nominal layer thicknesses of the stack in measured devices.

| Layer | SiO2 | W | SiO2 | W | SiO2 | Mo | AlN | Al |
|---|---|---|---|---|---|---|---|---|
| Thickness (nm) | 790 | 505 | 620 | 510 | 1030 | 300 | 1960 | 150 |

Figure 10:
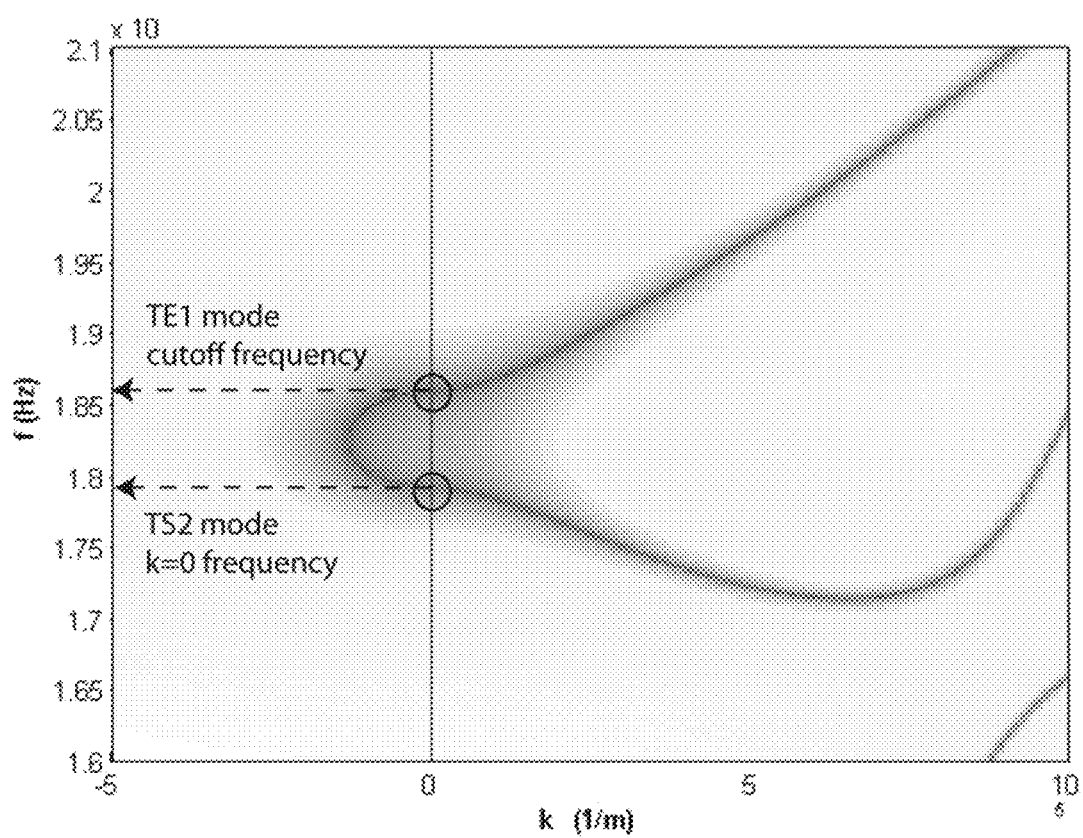
FIG. 10: Dispersion curves calculated for the electrode region of the example filter. TE1 cutoff frequency is ~1850 MHz. TS2 k=0 frequency ~1780 MHz.
Figure 11:
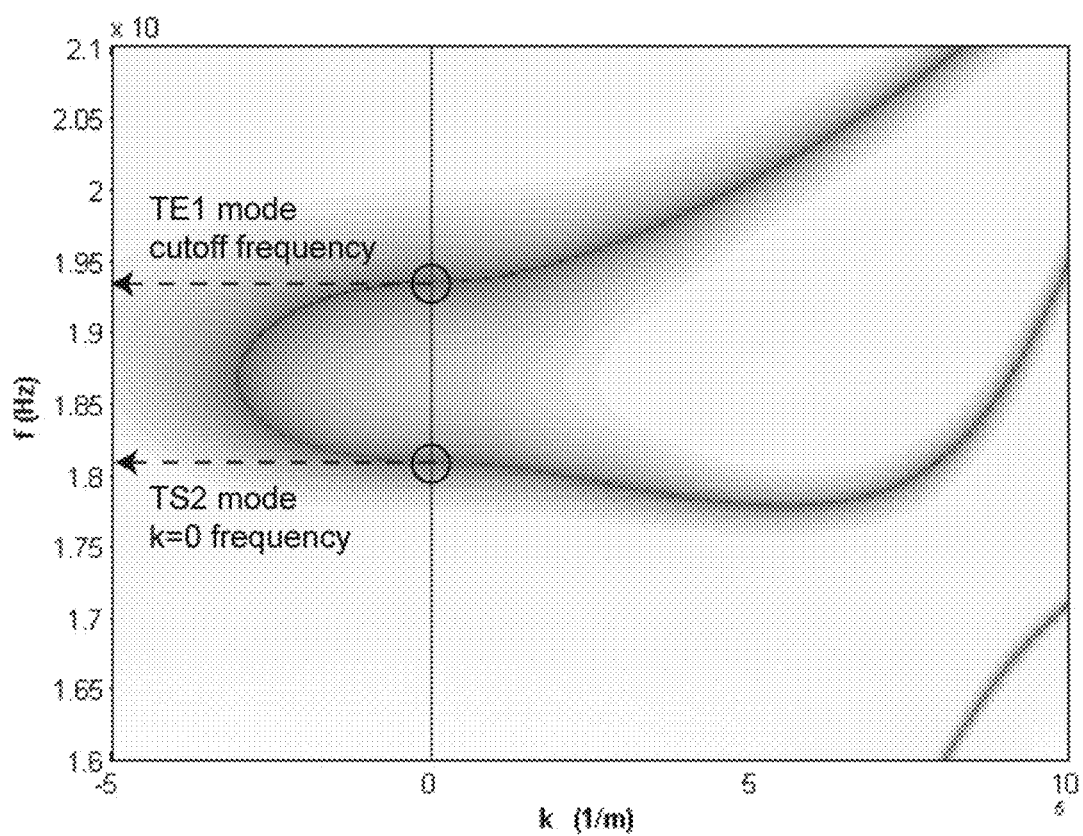
FIG. 11: Dispersion curves calculated for the outside region of the example filter stack. TE1 cutoff frequency is ~1935 MHz. TS2 k=0 frequency is ~1808 MHz.

Calculated dispersions for the electrode and outside regions are shown in FIGS. 10 and 11.

Figure 12:
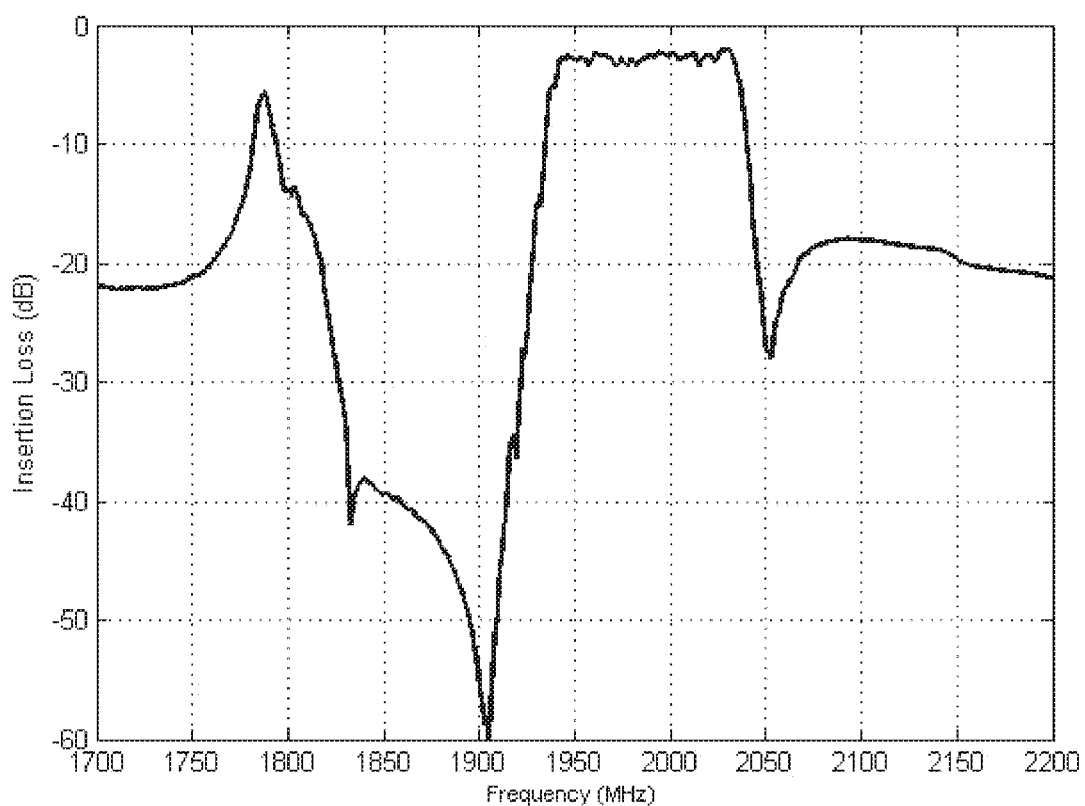
FIG. 12: Measured electrical frequency response of a 31-electrode LBAW filter designed and manufactured at VTT. Post-measurement (with software) matching to 120Ω parallel to 5 nH at both ports was used. Center frequency is 1988 MHz, minimum insertion loss is 2.1 dB, and relative 3-dB bandwidth is 97 MHz (4.9% of center frequency).

S-parameter measurements were done on-wafer with a vector network analyzed (HP8720D). Measurement was done at 50Ω system impedances. As-measured results were matched (in Matlab) after the measurement. Insertion loss IL=20 log 10(|S21|) is plotted in FIG. 12.

Within the frequency range of 1-5 GHz, the bandwidth at 2 GHz was found to be 5%. This is compared to 4% at 2 GHz of the closest prior art version. Therefore, an increase of 25% bandwidth is realized in the present example. One of ordinary skill in the art will immediately recognize the advantage such an increase in bandwidth at 2 GHz represents to the state of the art.

Furthermore, when looking at the required pattern resolution at 2 GHz, the present example critical dimension was greater than 1 µm. Compared to a standard SAW coupled resonator filter at 2 GHz which has a required critical dimension of around 0.5 µm, there is seen an over 100% increase in resolution requirement using this embodiment.

A second example is presented herein with ZnO as the piezoelectric material. The thin-film stack of this example filter is shown in Table 8.

TABLE 8

Layer thicknesses in the second example device from bottom to top.

| Layer | SiO2 | W | SiO2 | W | SiO2 | Mo | ZnO | Al |
|---|---|---|---|---|---|---|---|---|
| Thickness (nm) | 746 | 654 | 746 | 654 | 746 | 300 | d = 1100 | 200 |
| % of d | | | | | | 67 | 27 d = 32% of λ | 18 |

The simulated matched passband width obtained with the example stack of Table 8, number of electrodes N=31, electrode width W=6 µm and gap with G=3 µm is 90 MHz at 1933 MHz center frequency (4.7%).

Another example is obtained by replacing the mirror stack of the previous example (Table 8) with an air gap. That is, all layers below bottom electrode (Mo) are removed. The simulated matched bandwidth obtained with N=11, W=6 µm and G=3 µm is 114 MHz at 1933 MHz (5.9%).

Furthermore, 'laterally coupled solidly mounted BAW Resonators at 1.9 GHz'. Julkaisussa proceedings of international ultrasonics symposium 2009. IEEE, 2009 s. 847-850 by Meltaus et al., is herein incorporated by reference in its entirety.

Modifying Steepness of Passband Edges

A laterally acoustically coupled filter (LBAW) has several advantages over ladder filters consisting of separate resonators. These advantages include smaller size, better stop-band attenuation, the possibility to implement a change from a balanced signal to an unbalanced one (balun) without a separate component, as well to modify the impedance level between the ports. However, LBAW filters have by nature gentler pass band edges than, for example, ladder filters, which limits their possible applications.

As can be seen from FIGS. 13-20, series and/or parallel BAW resonators are used in the input and output to position zeros, i.e. attenuation peaks in the frequency response of the LBAW filter. The frequencies of the attenuation peaks can be determined by altering the mass load of the resonator. For example, altering can be done by etching an AlN layer, growing additional material on top of the resonator or other suitable method known in the art.

It is possible to use various combinations of series and parallel resonators to shape the end response. Furthermore, the device's impedance, i.e. matching, can be adjusted through the size of the resonator.

FIGS. 13-20 show how the frequency response of an LBAW filter can be shaped with the aid of simple series and parallel resonators. With the aid of zeros set on both sides of the pass band, the edges of the pass band can be steepened while still retaining a good band shape. The resonators also improve stop-band attenuation near to the pass band and act as transmatch circuits.

Figure 13:
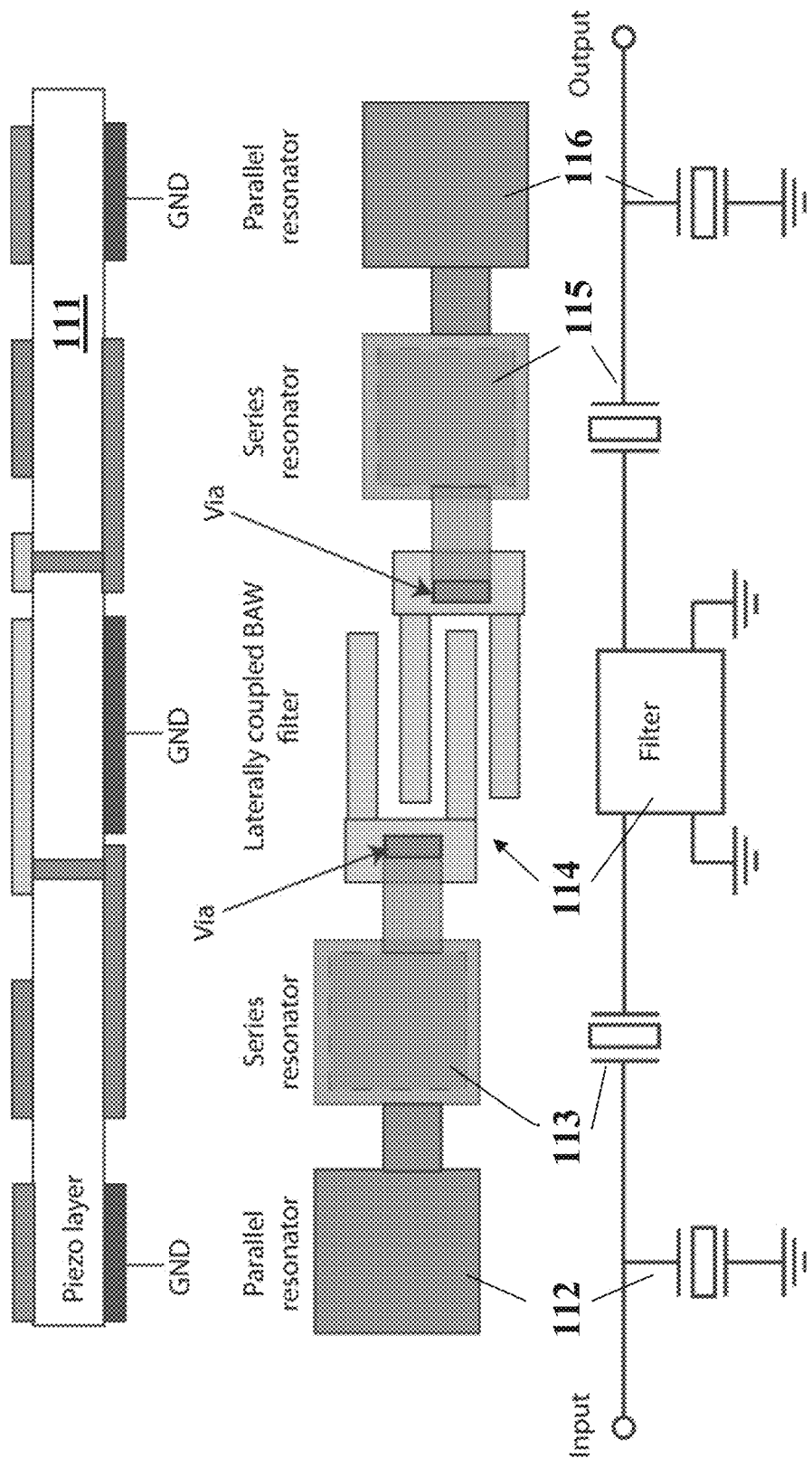
FIG. 13: Connection of resonators to an LBAW filter as a schematic diagram and a circuit diagram.

FIG. 13 shows a schematic diagram of a LBAW filter with series and parallel resonators. The most suitable filter combination can be selected for each construction. The filter has a piezoelectric layer 111 supporting, a parallel resonator 112 and a series resonator 113 at the input of a LBAW filter 114, as well as a series resonator 115 and a parallel resonator 116 at the output of the LBAW filter 114.

Acoustic series 113, 115 and/or parallel resonators 112, 116 can be connected to the input and output. Various combinations of the resonators described are possible. In the parallel resonators 112, 116 the lower electrode is grounded. In the series resonators 113, 115 the signal goes to the lower electrode.

The following simulations shown in FIGS. 14-20 are based on an acoustic thin-film stack, the materials and film thicknesses of which (from the substrate upwards) are listed in Table 9 below.

TABLE 9

Thin-film pack used in the simulations

| Material | Si | SiO2 | W | SiO2 | W | SiO2 | Ti | Mo | AlN | TiW | Al |
|---|---|---|---|---|---|---|---|---|---|---|---|
| Thickness nm | Substrate | 786 | 505 | 621 | 507 | 1029 | 25 | 296 | 1960 | 17 | 106 |

The frequency of the series 113, 115 and parallel resonators 112, 116 can be altered, in such a way that the resonator's series and parallel resonances will occur at the desired frequencies. The frequency can be adjusted by altering the thickness of one or more thin films. The thickness of the piezoelectric film has been altered by thinning or material can be grown on top of the resonators to form a mass load, in which case the resonance frequency will decrease.

Figure 14:
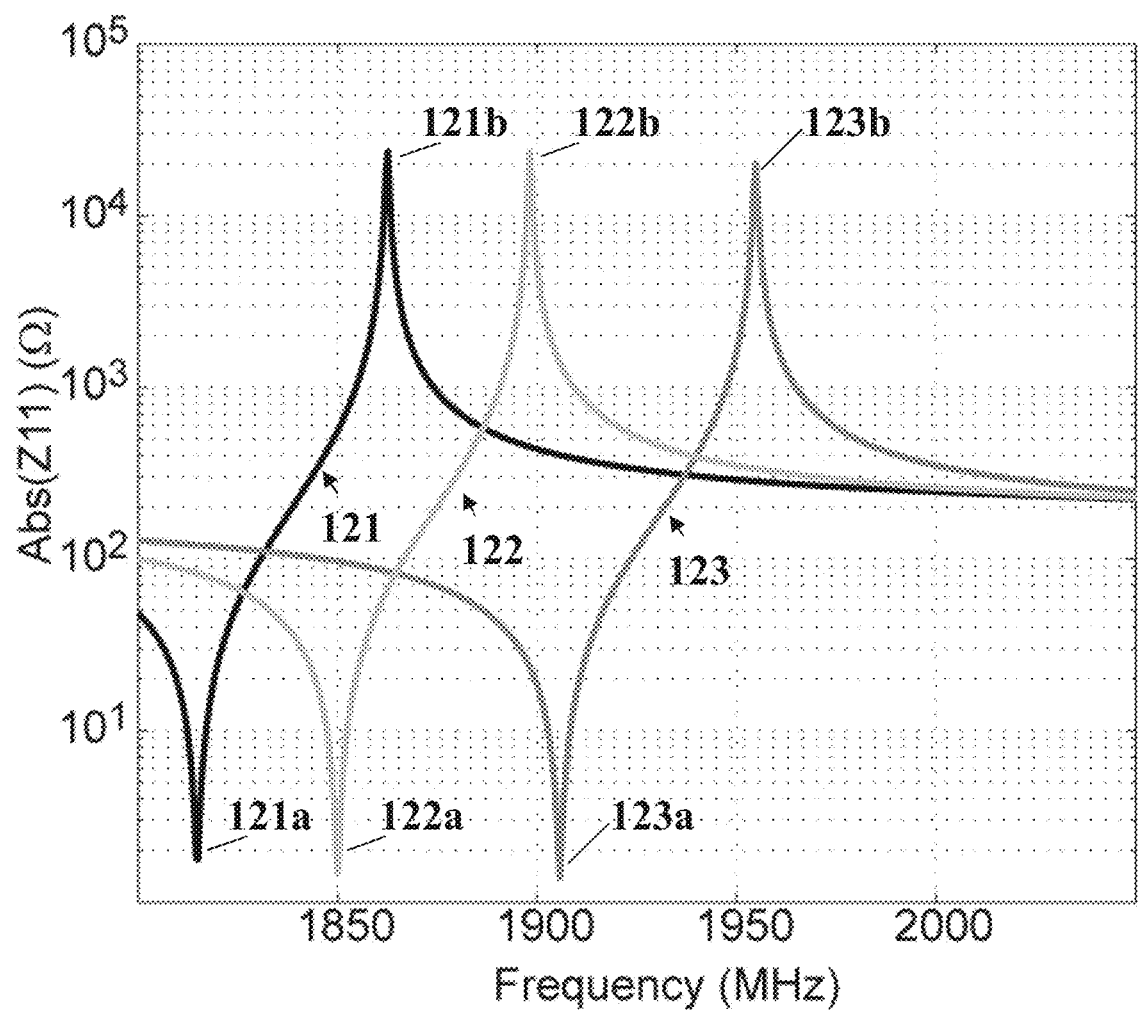
FIG. 14: Simulated frequency response for a resonator.

FIG. 14 shows the frequency responses of three BAW resonators, simulated using 1D models. The black curve is the resonance response 121 produced by the stack of Table 1. The light-grey curve 122 corresponds to a frequency-shifted resonator, with an AlN layer that has been thinned to 1900 nm. This resonator is used as the parallel resonator in the simulations. The dark-grey curve 123 corresponds to a frequency-shifted resonator that has been correspondingly thinned to 1810 nm. This resonator is used as the series resonator in the simulations.

The simulated frequency response in FIG. 14 is for a resonator sized 100 μm×100 μm using the stack (black) of Table 1. The frequency of the series resonance of the unmodified resonator 121a is 1815 MHz and the frequency of the parallel resonance 121b is 1860 MHz. The light-grey and dark-grey curves are the simulated responses for the frequency-shifted resonators. The series resonance 122a of the parallel resonator has been shifted to the frequency 1850 MHz, which is below the pass band, so that the parallel resonance 122b is at the frequency 1900 MHz, i.e. it is on the pass band. The series resonance 123a of the series resonator is 1905 MHz (on the pass band) and the parallel resonance 123b is 1960 MHz (above the pass band). The filter's response receives powerful attenuations at the series resonance frequency of the parallel resonator and at the parallel resonance frequency of the series resonator.

Unwanted lateral responses will arise in a real two-dimensional resonator, which 1D simulation does not take into account. To ensure the best response, it would be good to use some structure, which attenuates the lateral resonance shapes, in the resonators. The following simulations present the responses of two different LBAW constructions and the effects of the resonators on the electrical frequency response.

Figure 15:
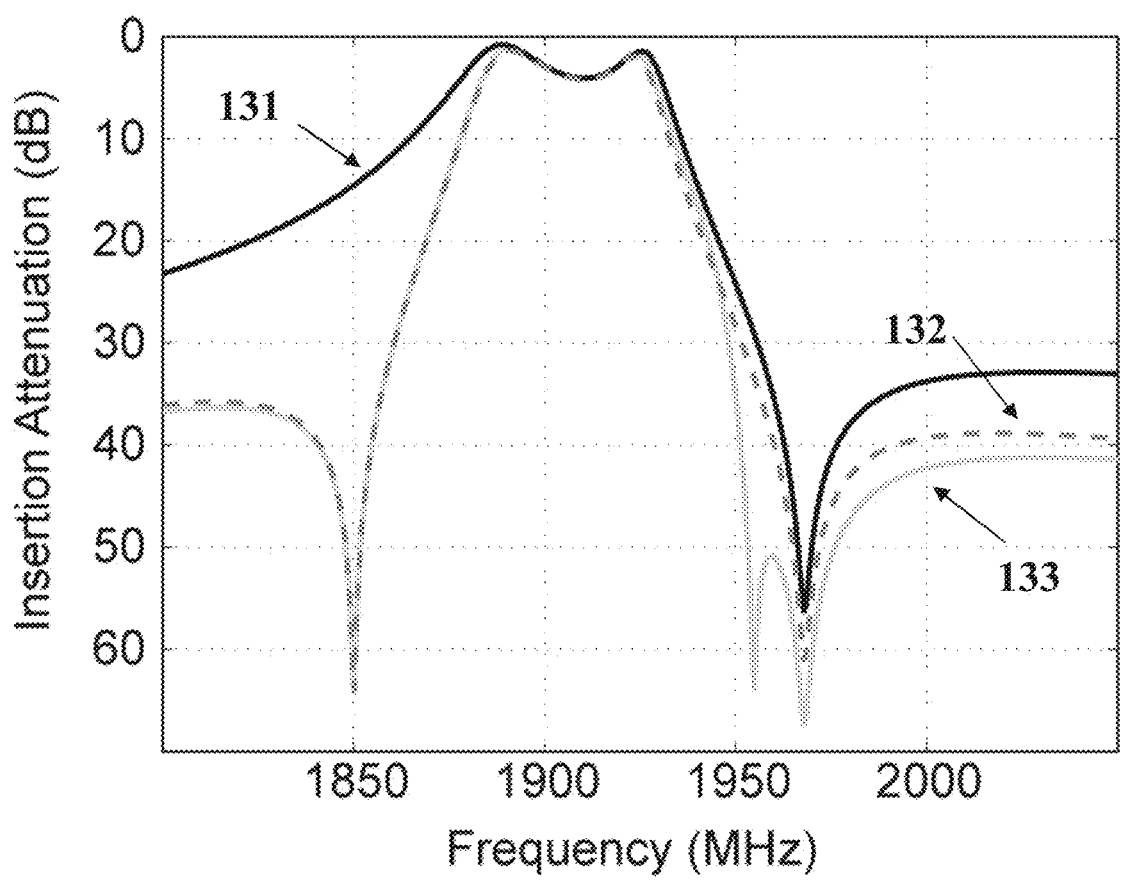
FIG. 15: Simulated frequency response for a two-finger LBAW filter (black), a parallel resonator in the input (dark grey), parallel and series resonators in the output (light grey).

FIG. 15 pertains to a two-finger LBAW filter. In the figure, the simulated frequency response of a two-finger LBAW filter based on the stack of Table 1 is shown in black, 131. The response is matched with an impedance of 500 Ohm. On the right-hand side of the pass band is a zero point produced by the acoustic structure, but the lower edge of the band is very gentle.

If a parallel resonator 112 is added to the input of the construction, i.e. response 122 of FIG. 14, a strong attenuation peak, which appears as the dark-grey response 132 in FIG. 15, arises at the series-resonance frequency (1850 MHz) below the pass band. Therefore, stop-band attenuation improves by more than 10 dB below the pass band and by about 7 dB above it. As can be seen though, at the same time the bandwidth decreases somewhat.

When a series resonator 113 is also added to the input, i.e. the response 123 of FIG. 14, an attenuation peak is obtained at its parallel resonance frequency (1960 MHz). The steepness of the upper edge of the pass band improves and the stop-band attenuation improves by some dB, compared to only a parallel resonator 112.

FIG. 15 uses a black curve to show the resonance response 131 of a two-finger LBAW filter, a dark-grey curve to show the resonance response 132 if there is a parallel resonator in the input of the filter 131, and a light-grey curve to show the resonance response 133 if there are parallel and series resonators in the input of the filter 131.

Figure 16:
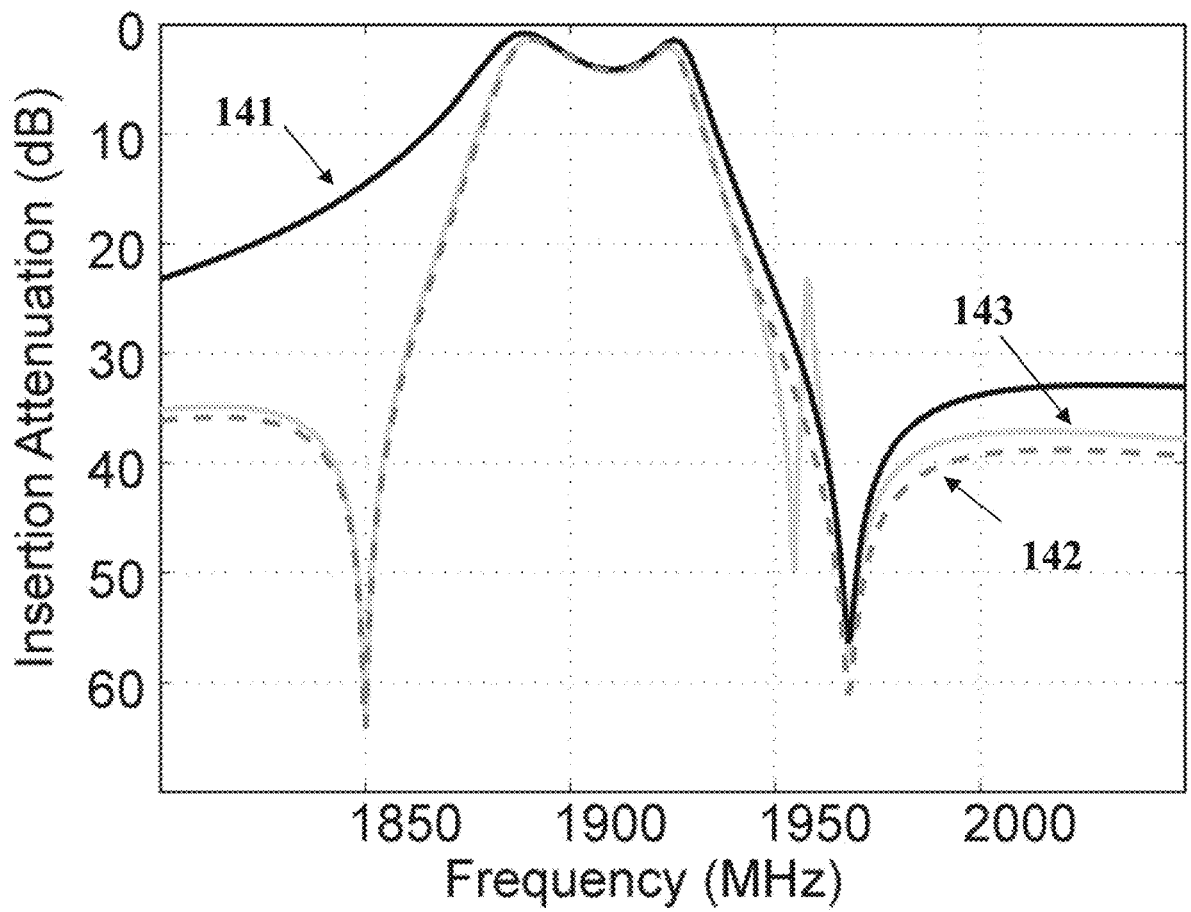
FIG. 16: Simulated frequency response for a two-finger LBAW filter (black), a parallel resonator in the output (dark grey), parallel and series resonators in the output (light grey).

FIG. 16 shows the same resonator combinations in the output port. FIG. 16 uses a black curve to show the resonance response 141 of a two-finger LBAW filter, a dark-grey curve to show the resonance response 142 if there is a parallel resonator in the output of the filter 141, and a light-grey curve to show the resonance response 143 if there are parallel and series resonators in the output of the filter 141. A parallel resonator will have nearly the same effect as in the input port, but a series resonator will create a peak in the response.

Figure 17:
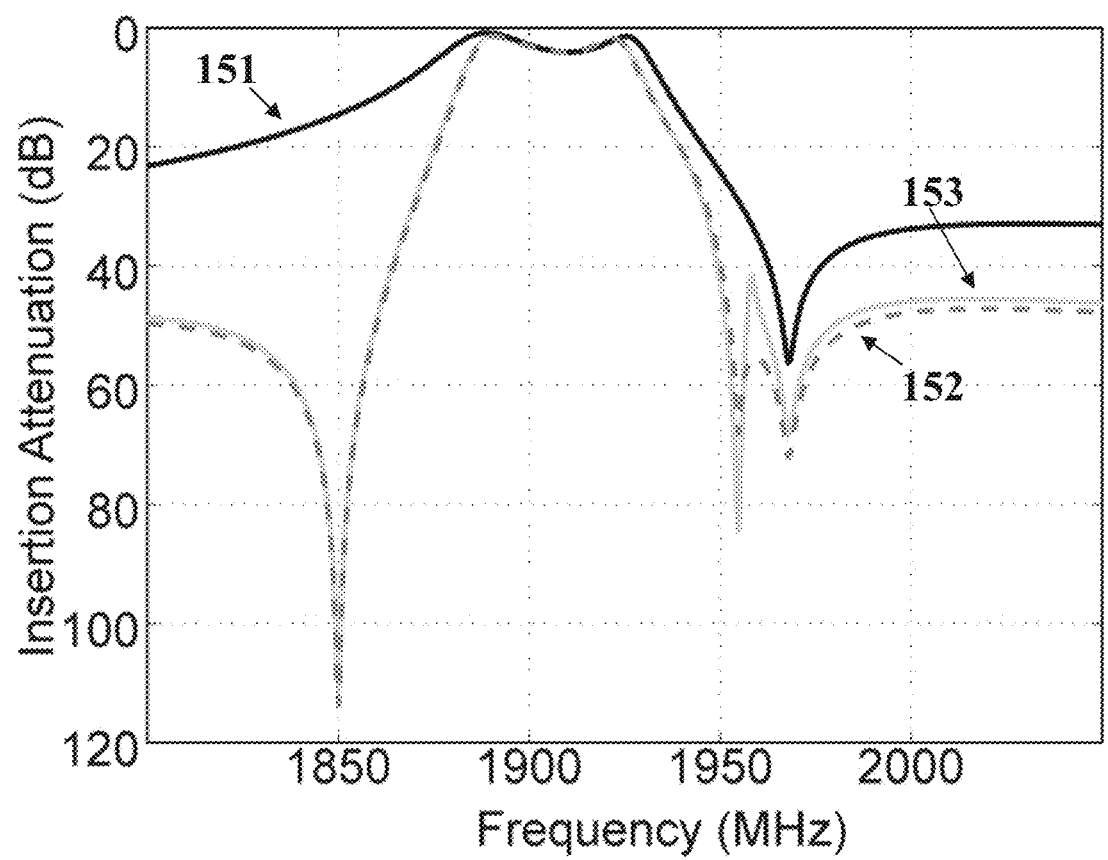
FIG. 17: Simulated frequency response for a two-finger LBAW filter (black), parallel and series resonators in the input as well as a parallel resonator in the output (dark grey), parallel and series resonators in the input and in the output (light grey).

FIG. 17 shows other possibilities. FIG. 17 uses a black curve to show the resonance response 151 of a two-finger LBAW filter, a dark-grey curve to show the resonance response 152 if there are parallel and series resonators in the input and a parallel resonator in the output, and a light-grey curve to show the resonance response 153 if there are parallel and series resonators in both the input and the output.

The best result is achieved if both a series and a parallel resonator are added to the input and a parallel resonator is added to the output. With this configuration band-edge steepness improves considerably. Stop-band attenuation improves below the band by nearly 30 dB and above it by nearly 15 dB. At the same time, the width of the pass band decreases to some extent. In accordance with the present example the decrease is as follows; absolute 5 dB pass band: 55 MHz (2.9%)->42 MHz (2.2%) where the percentage is compared to a frequency of 1900 MHz.

Figure 18:
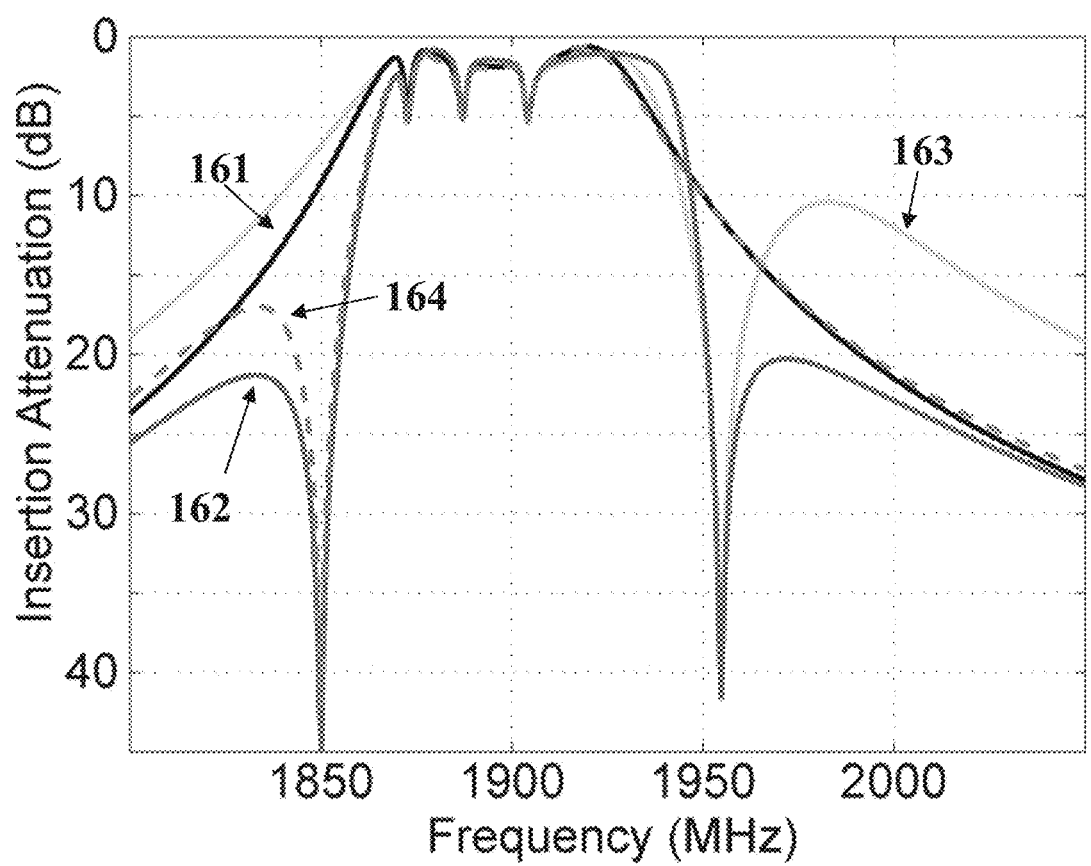
FIG. 18: Simulated frequency response for a nine-finger LBAW filter.
Figure 19:
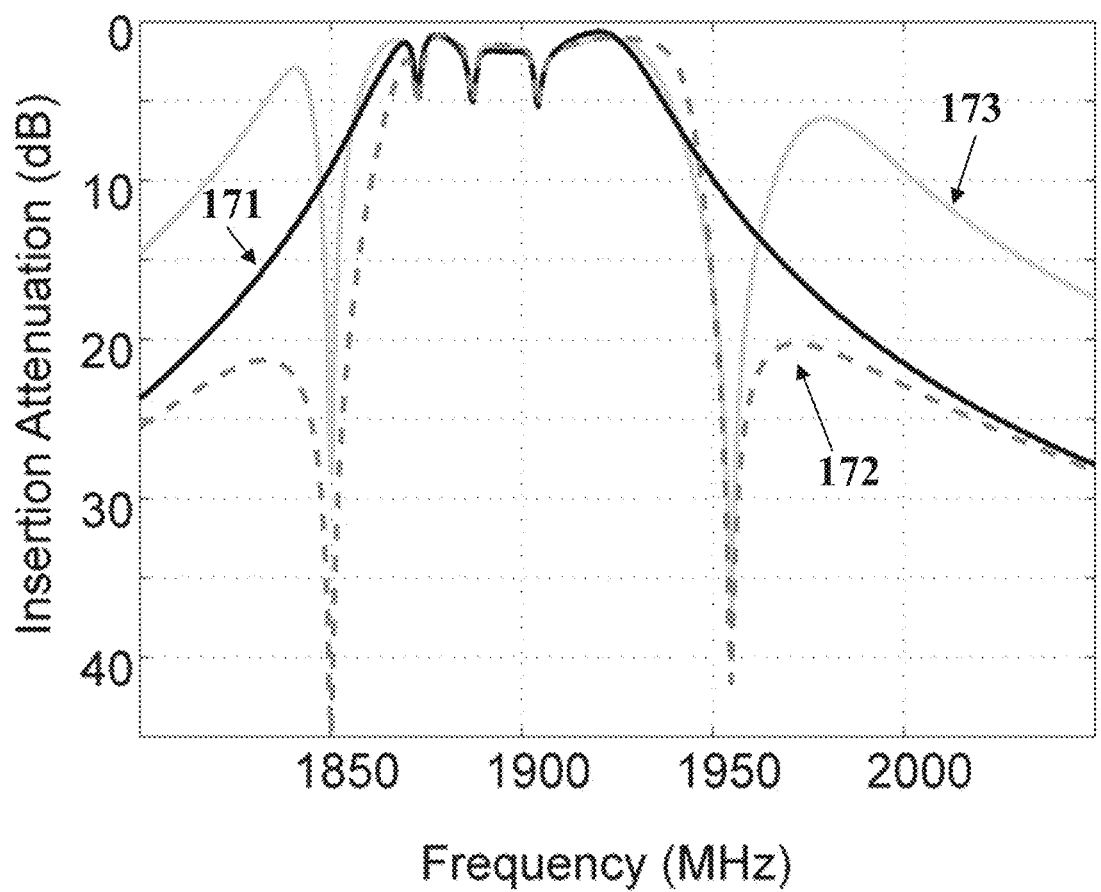
FIG. 19: Simulated frequency response for a nine-finger LBAW filter which has series and parallel resonators in the input (dark grey) and in the output (light grey).
Figure 20:
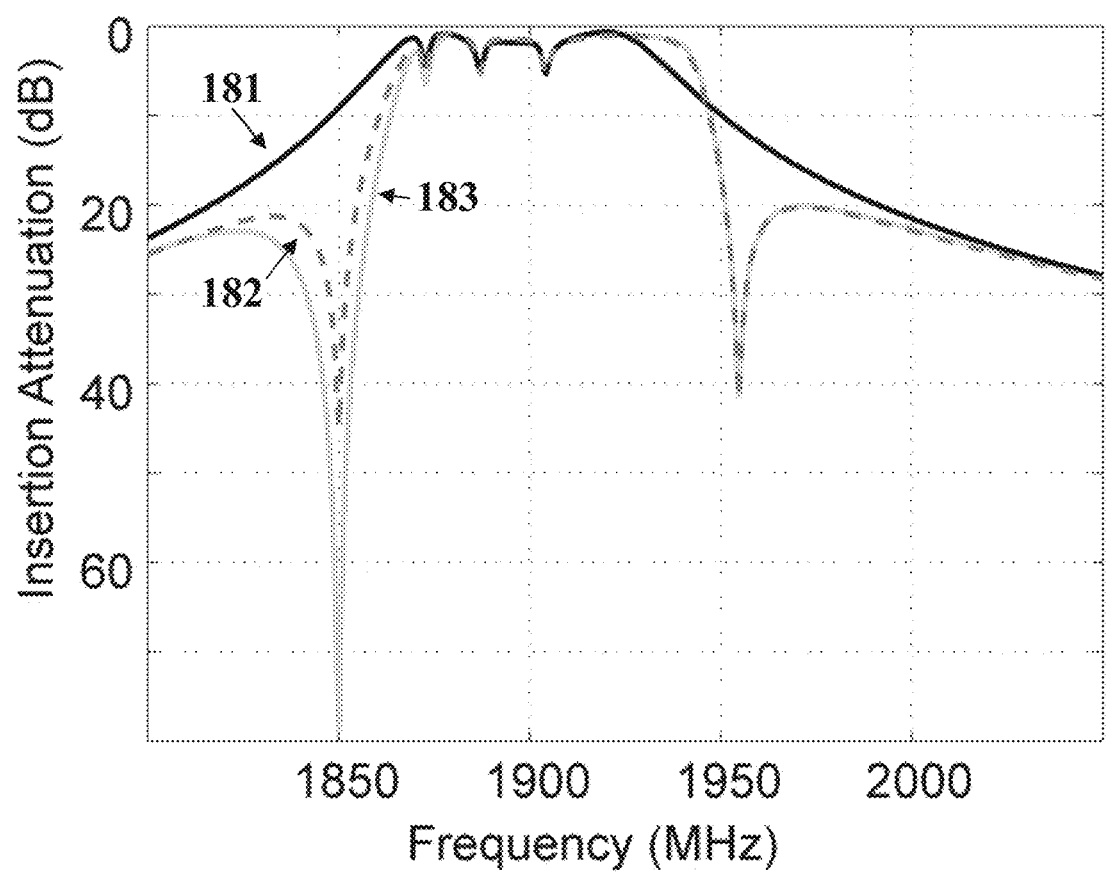
FIG. 20: Simulated frequency response for a nine-finger LBAW filter, the stop-band attenuation of which improves as the frequency moves away from the pass band.

The examples according to FIGS. 18-20 deal with a nine-finger LBAW filter. As shown, by increasing the number of fingers the filter's bandwidth can be increased.

FIG. 18 uses black to show the simulated frequency response 161 of a 9-finger LBAW filter based on the stack of Table 1 with the response matched by an impedance of 100Ω. The bandwidth (abs. 5 dB) is 78 MHz (4.1%), but both edges of the pass band are very gentle.

By adding a parallel resonator, such as with frequency response 122 to the input, the dark-grey frequency-response curve 162 is obtained, in which there is an attenuation peak at a frequency of 1850 MHz. A series resonator with the example frequency response 123 in the input gives the light-grey curve 163, in which there is an attenuation peak at a frequency of 1960 MHz. Both resonators in the input create the dark-grey curve 164, in which there are peaks at both frequencies. As can be seen, the upper edge of the pass band is both wider and better shaped, i.e. there is smaller insertion attenuation. The stop-band attenuation improves below the pass band by about 3 dB and above it by about 2 dB. Unlike a ladder filter, the stop-band attenuation increases as one moves away from the pass band frequency.

In FIG. 19, series and parallel resonators in the input and output are compared. FIG. 19 uses black to show the simulated frequency response 171 of a 9-finger LBAW filter based on the stack of Table 1. Both resonators in the input create the dark-grey curve 172, in which there are peaks at the frequencies 1850 MHz and 1960 MHz of the previous example as well. On the other hand, the adding of both resonators to the output instead of the input weakens the stop-band attenuation, according to the light-grey curve 173.

FIG. 20 uses black to show the simulated frequency response 181 of a 9-finger LBAW filter based on the stack of Table 1. Both resonators in the input create the dark-grey curve 182, in which there are peaks at the frequencies 1850 MHz and 1960 MHz of the previous example as well. In addition to the above, the addition of a parallel resonator to the output improves the response slightly, according to the light-grey curve 183. The absolute 5-dB bandwidth of the filter achieved is 77 MHz (4%). The stop-band attenuation improves as one moves away in frequency from the pass band.

As is seen from FIGS. 14-20, the use of various combinations of resonators allows for the tailoring of LBAW frequency responses. While several combinations of resonators has been shown herein, based on the disclosed description, one of ordinary skill in the art will recognize further combinations, and sub-combinations, which achieve the same or similar goals as the presented combinations without departing from the scope of the invention.

The present invention is not limited to the exemplary examples described herein. The exemplary examples and embodiments merely show some of the advantageous effects of a filter designed according to the present invention. However, one of ordinary skill in the art will recognize obvious variations and combinations of elements described herein which do not part from the scope of the present invention.

Generally, to obtain a filter according to the present embodiments with some or all of the desired, advantageous effects, the following should normally be designed or accounted for in the filter design; correct acoustic properties i.e. dispersion, TE1 mode is trapped in the structure (outside region preferably has evanescent wave at operation frequency range), maximum frequency difference between even and odd resonance modes, long lateral wavelength at the even mode (long decay length outside the electrodes), high enough Q value for low losses, appropriate electrode design, odd mode is trapped, insuring fabrication tolerances are not critical e.g. not too narrow gaps, matching electrode length and number of electrodes (not too much resistance), choosing small enough component size, insuring no intermediate lateral modes that would produce notches in the passband.

When taking into account some or all of the factors mentioned above, it is possible to produce a filter with extremely wide passband and a simple fabrication process. Wide obtainable band gives freedom to design using wider electrodes and gaps. More electrodes eases the matching to 50 Ohms. The need to use matching inductances or other matching elements is smaller and the requirement to gap width is relaxed allowing for easier fabrication. Better performance (lower losses etc) can be achieved when there is enough bandwidth to sacrifice a portion of the bandwidth.

Other materials besides 6 mm symmetry group can be utilized such as thin-film forms of piezoelectric SAW materials e.g. LiNbO3 and LiTaO3. Additionally, operation frequency does not principally depend on electrode dimensions, but on film thicknesses. Therefore high frequency operation is possible and lithography is not a limiting factor.

As described above, the thin-film stack and electrode geometry can be designed such that the dispersion properties are beneficial for wide-band operation. The long wavelength and good acoustic coupling at even resonance mode can be ensured by bringing the electrode region's TE1 curve (if TE1 is the operating mode) close to gap region's TS2 curve. This makes possible long decay length in the gaps at even mode. At the same time, the frequency range within which the modes are trapped in the electrode structure becomes wider. Furthermore, the large number of electrodes (N>10) can be used to get long wavelength (low frequency) at even mode and short wavelength (high frequency) at even mode.

As the dispersion and wave behaviour in the complex structure described herein (multi-layer, lateral topology) is affected by several factors at once (layer materials and thicknesses, lateral geometry), some of which have opposite effects, it is extremely unlikely that optimal design could be found by trial and error. As such, the designer must have a clear idea of the way the properties need to be modified, as disclosed herein, in order to be able to create a useful filter according to the present invention.

The present invention is not limited to the exemplary embodiments and examples described herein. They are meant only to help describe the present invention. Further examples are described in U.S. Provisional application 61/392,955 for which the present application claims priority from and which is herein incorporated by reference in its entirety. Numerous variations in manufacturing processes, number of iterations, types of novel products and more will be recognizable to one of ordinary skill in the art without departing from the scope of the present invention.

The invention claimed is:

1. An acoustically coupled thin-film Bulk Acoustic Wave (BAW) filter, comprising;
a piezoelectric layer,
an input-port on the piezoelectric layer changing electrical signal into an acoustic wave, and
an output-port on the piezoelectric layer changing acoustic signal into electrical signal,
wherein
the ports include electrodes positioned such that acoustic coupling is achieved, the ports having an interdigital electrode structure such that the electrodes are connected alternatingly to the input port and the output port,
the filter is capable of operating in the first order thickness-extensional TE1 mode, and
wherein the mass loading by the interdigital electrodes is such that the k=0 frequency of the outside region's TS2 mode is between 93% and 99.9% of the electrode region's TE1 cutoff frequency,
wherein the electrode topology is such that gap width G between the interdigital electrodes ensures good coupling at the even mode and
wherein the gap width is between 20% and 120% of the evanescent acoustic wave's decay length in the gap at the desired even resonance mode, where the wave's decay length is expressed as the length at which amplitude A=A0*1/e of the original amplitude A0.

2. A filter in accordance with claim 1, wherein the k=0 frequency of the outside region's TS2 mode is between 95% and 99% of the electrode region's TE1 cutoff frequency.

3. A filter in accordance with claim 2, wherein the k=0 frequency of the outside region's TS2 mode is between 97% and 98% of the electrode region's TE1 cutoff frequency.

4. A filter in accordance with claim 1, wherein the electrodes are positioned such that acoustic vibration in the lateral direction from one electrode to the other acoustically couples the electrodes.

5. A filter in accordance with claim 1, wherein the electrode width W is such that more than one half-wavelength of the lateral acoustic wave's wavelength cannot fit within the electrode width.

6. A filter in accordance with claim 1, wherein the electrode width W is smaller than the lateral acoustic wave's wavelength λodd at the desired odd resonance mode.

7. A filter in accordance with claim 1, wherein the number of electrodes N, electrode width W and gap width G are designed such that the desired wavelength of the lateral acoustic wave at the even mode resonance frequency is achieved.

8. A filter in accordance with claim 7, wherein N*W+N*G=λeven/2, where λeven is the wavelength of the lateral acoustic wave at the even mode resonance frequency, and that the highest-order mode trapped in the structure is the desired odd mode resonance.

9. A filter in accordance with claim 1, wherein the electrode width W is such that the wavelength of the lateral acoustic wave at the desired odd mode resonance frequency, λodd, is obtained.

10. A filter in accordance with claim 9, wherein W is between 25% and 50% of $\lambda_{odd}$.

11. A filter in accordance with claim 1, wherein matching to the system impedance level is achieved, while retaining a desired loss level within the passband by the combination of N, W, and electrode length L.

12. A filter in accordance with claim 1, wherein the piezoelectric layer is formed on an acoustic Bragg structure formed as a thin film stack or on an air-gap structure.

13. A filter in accordance with claim 1, wherein there being one or more parallel resonator, and/or series resonators added to the filter.

14. A filter in accordance with claim 1, wherein one or more of the resonators are coupled before and/or after the filter.

15. A filter in accordance with claim 1, wherein the number of electrodes is more than 10.

16. A filter in accordance with claim 1, wherein the filter is capable of operating in the TE1 mode in a gigahertz (GHz) frequency range.

17. A filter in accordance with claim 1, wherein the filter has type 1 dispersion.

18. A filter in accordance with claim 1, wherein an acoustic Bragg mirror composed of alternating high and low acoustic impedance (Z) material layers serves to isolate the vibration in the piezoelectric thin film from the substrate.

19. A filter in accordance with claim 1, wherein the gap width G is not constant.

* * * * *